US012709797B2

(12) United States Patent
Sharma et al.

(10) Patent No.: US 12,709,797 B2
(45) Date of Patent: Aug. 18, 2026

(54) METHODS OF SELECTIVE DEPOSITION AND CHEMICAL DELIVERY SYSTEMS

(71) Applicant: Lam Research Corporation, Fremont, CA (US)

(72) Inventors: Kashish Sharma, Tigard, OR (US); Nupur Bihari, Tualatin, OR (US); Benjamin Edwards, Fremont, CA (US); Arpan Pravin Mahorowala, West Linn, OR (US); Avinash Gouda Doddamani, Bellary District (IN); Ashwin Kumar, Bangalore (IN); Avinash Jaiswal, Bangalore (IN)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/839,370

(22) PCT Filed: Mar. 10, 2023

(86) PCT No.: PCT/US2023/014982
§ 371 (c)(1),
(2) Date: Aug. 16, 2024

(87) PCT Pub. No.: WO2023/172736
PCT Pub. Date: Sep. 14, 2023

(65) Prior Publication Data

US 2026/0022454 A1 Jan. 22, 2026

Related U.S. Application Data

(60) Provisional application No. 63/379,999, filed on Oct. 18, 2022, provisional application No. 63/319,205, filed on Mar. 11, 2022.

(51) Int. Cl.
*C23C 16/40* (2006.01)
*C23C 16/02* (2006.01)
(Continued)

(52) U.S. Cl.
CPC ........... *C23C 16/403* (2013.01); *C23C 16/02* (2013.01); *C23C 16/042* (2013.01);
(Continued)

(58) Field of Classification Search
CPC ..... C23C 16/403; C23C 16/02; C23C 16/042; C23C 16/45544; C23C 16/45553; C23C 16/52
See application file for complete search history.

(56) References Cited

U.S. PATENT DOCUMENTS 8,728,956 B2 5/2014 Lavoie et al.
9,355,839 B2 5/2016 Swaminathan et al.
(Continued)

FOREIGN PATENT DOCUMENTS

CN 105408244 A 3/2016
CN 105556644 A 5/2016
(Continued)

OTHER PUBLICATIONS

A.J.M Mackus, et al., "Fully Self-Aligned Vias: The Killer Application for Area-Selective ALD?—A Discussion of Requirements for Implementation in High Volume Manufacturing" 2019, 7, Atomic Limits, pp. 1-6.

(Continued)

*Primary Examiner* — Michael G Miller
(74) *Attorney, Agent, or Firm* — Weaver Austin Villeneuve & Sampson LLP

(57) ABSTRACT

Systems and methods of selectively depositing metal oxide on an exposed metal surface relative to a dielectric material on a substrate by pre-treatment with a hydroxy species-generating plasma prior to inhibition of the metal surface with an inhibitor, and subsequent metal oxide deposition on the dielectric material are disclosed. Exemplary inhibitors include low vapor pressure inhibitors. Exemplary systems
(Continued)

include heated ampoules and gas lines for delivering inhibitors or other processing chemicals.

8 Claims, 12 Drawing Sheets

(51) Int. Cl.
*C23C 16/04* (2006.01)
*C23C 16/455* (2006.01)
*C23C 16/52* (2006.01)

(52) U.S. Cl.
CPC .. *C23C 16/45544* (2013.01); *C23C 16/45553* (2013.01); *C23C 16/52* (2013.01)

(56) References Cited

U.S. PATENT DOCUMENTS

| | | | |
|---|---|---|---|
| 10,038,079 | B1 | 7/2018 | Ohtou et al. |
| 10,043,656 | B1 | 8/2018 | Smith et al. |
| 10,662,526 | B2 | 5/2020 | Hausmann et al. |
| 11,404,275 | B2 | 8/2022 | Hausmann et al. |
| 2002/0155722 | A1 | 10/2002 | Satta et al. |
| 2002/0185225 | A1 | 12/2002 | Toshima et al. |
| 2004/0087176 | A1 | 5/2004 | Colburn et al. |
| 2008/0099933 | A1* | 5/2008 | Choi .................. C23C 16/4481 261/127 |
| 2010/0144146 | A1 | 6/2010 | Utaka et al. |
| 2011/0025673 | A1 | 2/2011 | Chen et al. |
| 2011/0256724 | A1 | 10/2011 | Chandrasekharan et al. |
| 2011/0256734 | A1 | 10/2011 | Hausmann et al. |
| 2012/0225553 | A1 | 9/2012 | Lazovsky et al. |
| 2015/0159273 | A1* | 6/2015 | Winter ............. C23C 16/45553 423/592.1 |
| 2015/0217330 | A1* | 8/2015 | Haukka ............... C23C 18/1208 |
| 2015/0299848 | A1* | 10/2015 | Haukka .................. C23C 16/18 427/256 |
| 2015/0299858 | A1* | 10/2015 | Yudovsky ........... C23C 16/4481 427/255.28 |
| 2016/0163538 | A1 | 6/2016 | Nakazumi et al. |
| 2016/0190060 | A1 | 6/2016 | Bristol et al. |
| 2016/0222504 | A1* | 8/2016 | Haukka .................. C23C 16/04 |
| 2017/0012001 | A1 | 1/2017 | Gordon et al. |
| 2017/0037513 | A1* | 2/2017 | Haukka .................. C23C 16/04 |
| 2017/0069527 | A1 | 3/2017 | Haukka et al. |
| 2017/0323776 | A1* | 11/2017 | Färm ................. H01L 21/02189 |
| 2017/0323781 | A1 | 11/2017 | Kachian et al. |
| 2017/0342553 | A1 | 11/2017 | Yu et al. |
| 2018/0010247 | A1* | 1/2018 | Niskanen ................ C23C 16/06 |
| 2018/0012752 | A1 | 1/2018 | Tapily |
| 2018/0151345 | A1* | 5/2018 | Haukka ............. H01L 21/02178 |
| 2018/0166379 | A1 | 6/2018 | Yeo et al. |
| 2018/0366317 | A1 | 12/2018 | Ke et al. |
| 2019/0157079 | A1 | 5/2019 | Ke et al. |
| 2019/0164758 | A1 | 5/2019 | Su et al. |
| 2020/0013615 | A1* | 1/2020 | Hausmann ........ C23C 16/45534 |
| 2020/0043776 | A1 | 2/2020 | Hausmann et al. |
| 2020/0105515 | A1 | 4/2020 | Maes et al. |
| 2020/0234943 | A1 | 7/2020 | Bhuyan et al. |
| 2020/0308416 | A1 | 10/2020 | Lei et al. |
| 2020/0354834 | A1* | 11/2020 | De Silva ................. C23C 16/04 |
| 2021/0005460 | A1 | 1/2021 | Hausmann et al. |
| 2021/0159077 | A1 | 5/2021 | Longrie et al. |
| 2021/0398797 | A1 | 12/2021 | Maes et al. |
| 2022/0319854 | A1 | 10/2022 | Hausmann et al. |
| 2023/0386831 | A1 | 11/2023 | Sharma et al. |

FOREIGN PATENT DOCUMENTS

| | | | |
|---|---|---|---|
| CN | 108028172 | A | 5/2018 |
| CN | 111108232 | A | 5/2020 |
| JP | 2019165256 | A | 9/2019 |
| KR | 100561493 | B1 | 3/2006 |
| KR | 1020080109218 | A | 12/2008 |
| KR | 20100126507 | A | 12/2010 |
| KR | 20170125876 | A | 11/2017 |
| KR | 20170135760 | A | 12/2017 |
| KR | 20180006864 | A | 1/2018 |
| KR | 20180029934 | A | 3/2018 |
| KR | 20200019271 | A | 2/2020 |
| KR | 20200108242 | A | 9/2020 |
| TW | I722301 | B | 3/2021 |
| WO | WO-2011141628 | A1 | 11/2011 |
| WO | WO-2018195423 | A1 | 10/2018 |

OTHER PUBLICATIONS

CN Office Action dated May 23, 2024 in CN Application No. 201980027453.4, with English Translation.

International Preliminary Report on Patentability and Written Opinion dated Sep. 26, 2024 in PCT Application No. PCT/US2023/014982.

International Preliminary Report on Patentability dated Apr. 6, 2023 in Application No. PCT/US2021/051639.

International Preliminary Report on Patentability dated Sep. 17, 2020 issued in Application No. PCT/US2019/020408.

International Search Report and Written Opinion dated Jan. 7, 2022, in Application No. PCT/US2021/051639.

International Search Report and Written Opinion dated Jun. 17, 2019 issued in Application No. PCT/US2019/020408.

KR Office Action dated Apr. 24, 2024 in KR Application No. 10-2020-7028316 with English translation.

KR Office Action dated Dec. 26, 2024 in KR Application No. 10-2020-7028316, with English Translation.

TW Office Action and Search Report dated Jul. 21, 2025 in TW Application No. 110135524, with English Translation.

U.S. Advisory Action dated Nov. 2, 2023, in U.S. Appl. No. 17/808,046.

U.S. Final office Action dated Aug. 7, 2023 in U.S. Appl. No. 17/808,046.

U.S. Final Office Action dated Feb. 5, 2025 in U.S. Appl. No. 17/808,046.

U.S. Final Office Action dated Mar. 21, 2024 in U.S. Appl. No. 17/808,046.

U.S. Non Final Office Action dated Nov. 15, 2021 in U.S. Appl. No. 16/977,438.

U.S. Non-Final Office Action dated Aug. 9, 2024 in U.S. Appl. No. 17/808,046.

US Non-Final Office Action dated Jun. 16, 2025 in U.S. Appl. No. 18/245,939.

U.S. Non-Final office Action dated Mar. 16, 2023 in U.S. Appl. No. 17/808,046.

U.S. Non-Final Office Action dated Nov. 16, 2023 in U.S. Appl. No. 17/808,046.

U.S. Notice of Allowance dated Mar. 22, 2022 in U.S. Appl. No. 16/977,438.

International Search Report and Written Opinion dated Jul. 3, 2023, in Application No. PCT/US2023/014982.

KR Decision to Grant and Search Report dated Oct. 16, 2025 in KR Application No. 10-2020-7028316, with English translation.

KR Office Action dated Feb. 20, 2026 in KR Application No. 10-2022-7045627, with English Translation.

U.S. Notice of Allowance dated Nov. 21, 2025 in U.S. Appl. No. 18/245,939.

U.S. Appl. No. 19/533,637, inventors Sharma K et al., filed Feb. 9, 2026.

* cited by examiner

| Species | Wavelength |
|---|---|
| H | 434 |
| H | 486 |
| H | 656 |
| O | 437 |
| O | 497 |
| O | 502 |
| O | 533 |
| O | 544 |
| O | 605 |
| O | 616 |
| O | 646 |
| O | 700 |
| O | 777 |
| OH | 309 |

FIG. 4

METHODS OF SELECTIVE DEPOSITION AND CHEMICAL DELIVERY SYSTEMS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

As technology moving towards smaller and smaller nodes, patterning of small structures with extreme ultraviolet (EUV) lithography is getting increasingly difficult and it is becoming challenging to the land metal via on the metal lines in the back end of the line (BEOL). This leads to edge placement error (distance between the intended and actual position on the feature edge) and tiger tooth defects, which increase the RC delay and impact the device performance. The downscaling of the semiconductor devices is limited by the consequences of the edge placement errors.

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

SUMMARY

The present disclosure relates to apparatuses and methods for selectively depositing metal oxide on an exposed metal surface relative to a dielectric material on a substrate. In some embodiments, the methods include low-temperature pre-treatment with a hydroxy species-generating plasma prior to inhibition of the metal surface. Metal oxide may then be selectively deposited on the dielectric material. The pre-treatment mildly cleans the exposed metal surface, preparing it for inhibition while terminating the dielectric material with hydroxy groups. The hydroxy groups may react with deposition precursors or the metal oxide to be deposited for more uniform nucleation and growth. As a result, the selective inhibition and deposition are advantageously deployed to create controlled electrical connections and/or patterned dielectric layers. The apparatus may include heated ampoules and gas lines for delivering low vapor pressure processing chemicals such as inhibitors and/or precursors.

Accordingly, in a first aspect, the present disclosure encompasses a method of selectively depositing metal oxide on an exposed metal surface relative to a dielectric material on a substrate. In some embodiments, the method includes (a) providing the substrate including the dielectric material and the exposed metal surface; (b) contacting the substrate with a plasma generated from a hydrogen-containing source and an oxygen-containing source to generate hydroxy species, wherein the hydroxy species react with the dielectric material to form hydroxy-terminated dielectric material and with the metal surface to form an oxidized metal surface; and (c) exposing the oxidized metal surface and hydroxy-terminated dielectric material to a deposition inhibitor that selectively modifies the oxidized metal surface, forming an inhibited metal surface. In some embodiments, the method further includes (d) selectively depositing the metal oxide on the hydroxy-terminated dielectric material relative to the inhibited metal surface on the substrate. In some embodiments, (b) is performed at a substrate temperature from about 10° C. to about 300° C.

In some embodiments, the metal of the exposed metal surface is selected from: copper, cobalt, tungsten, ruthenium, tantalum, titanium, hafnium, zirconium, molybdenum and combinations thereof.

In some embodiments, the metal oxide is selected from: zirconium oxide, hafnium oxide, aluminum oxide, titanium oxide, tantalum oxide, yttrium oxide, lanthanum oxide and combinations thereof.

In some embodiments, the aluminum oxide is deposited by an aluminum oxide precursor selected from: trimethylaluminum, dimethylaluminum chloride, aluminum chloride, dimethylaluminum isopropoxide, and triethylaluminium.

In some embodiments, the dielectric material is selected from: silicon dioxide, doped silicon dioxide, silicon nitride, doped silicon carbide, silicon oxycarbide, silicon oxynitride and silicon carbonitride.

In some embodiments, the deposition inhibitor is selected from: sulfur-containing compounds, phosphorus-containing compounds, and silicon-containing compounds.

In some embodiments, the plasma is generated in situ.

In some embodiments, the plasma is generated remotely.

In some embodiments, the plasma is a capacitively-coupled plasma.

In some embodiments, the oxygen-containing source is selected from: an oxygen plasma, a plasma of oxygen and argon, a plasma of oxygen and helium, an ozone plasma, and combinations thereof.

In some embodiments, the hydrogen-containing source is selected from: a hydrogen plasma, a plasma of hydrogen and argon, a plasma of hydrogen and helium, an ammonia plasma, and combinations thereof.

In some embodiments, the method also includes treating the inhibited metal surface to remove inhibitor.

Non-limiting metals for the exposed metal surface include copper (Cu), cobalt (Co), tungsten (W), ruthenium (Ru), tantalum (Ta), titanium (Ti), hafnium (Hf), zirconium (Zr), and/or molybdenum (Mo), as well as mixtures thereof, doped forms thereof, and/or alloys thereof. Non-limiting semiconductors include silicon (Si), germanium (Ge), silicon germanium (SiGe), doped Si, or doped Ge.

In particular embodiments, the dielectric material includes silicon (Si), silicon dioxide ($SiO_2$), doped $SiO_2$, silicon nitride, silicon carbide, silicon oxycarbide, silicon oxynitride, silicon carbon nitride, a low-κ dielectric, germanium, silicon germanium, or germanium silicon.

In some embodiments, contacting the substrate with a plasma occurs with a dose time of from about 1 second to about 600 seconds. In other embodiments, contacting the substrate with a plasma occurs at a temperature of from about 50° C. to about 200° C. and/or a pressure of about 1 Torr to 10 Torr. In particular embodiments, contacting the substrate with a plasma is conducted at a first temperature that is lower than a second temperature during deposition of the metal oxide.

In some embodiments, the deposition includes atomic layer deposition (ALD) or chemical vapor deposition (CVD), including plasma-enhanced forms thereof.

In some embodiments, the method further includes (e.g., before said depositing) annealing the inhibitor layer at a temperature of from about 250° C. to 350° C.

In some embodiments, the method further includes (e.g., after said depositing): further depositing a second layer on at least a portion of a surface of the first layer or the non-inhibited surface. In other embodiments, the method further includes (e.g., after said depositing or after said further depositing); post-treating the surface to remove the inhibitor layer. In yet other embodiments, the method further includes (e.g., after said post-treating): providing a patterned via including a metal, wherein the patterned via is configured to be electrically connected to the first region.

In a second aspect, the present disclosure encompasses an apparatus for selective deposition. In one embodiment, the apparatus includes; a processing chamber; a substrate holder in the processing chamber; one or more gas inlets for flowing gases into the processing chamber; a vacuum source for removing gases from the processing chamber; a plasma generator for generating a plasma within the processing chamber; and one or more controllers including machine-readable instructions for operating the one or more gas inlets, vacuum source, and plasma generator to deposit onto a semiconductor substrate.

In one embodiment, the machine-readable instructions of the one or more controllers includes instructions for:

(a) causing operation of the plasma generator to provide a plasma to pre-treat a surface of the semiconductor substrate;

(b) causing operation of the one or more gas inlets to flow an inhibitor into the processing chamber and provide an inhibitor layer on the exposed metal surface of a semiconductor substrate held in the substrate holder, wherein the semiconductor substrate further includes a dielectric material including a different material than the exposed metal surface;

(c) optionally causing operation of the vacuum source to remove at least some of the inhibitor from the processing chamber;

(d) optionally causing operation of the substrate holder to anneal the inhibitor layer at a temperature of from about 250° C. to 350° C.;

(e) optionally causing operation of the one or more gas inlets to flow a first precursor to deposit a first layer on at least a portion of a non-inhibited dielectric material;

(f) optionally causing operation of the one or more gas inlets to flow a second precursor to further deposit a second layer on at least a portion of a surface of the first layer of the non-inhibited dielectric material; and (g) optionally causing operation of the plasma generator, after (e) or (f), to provide a plasma to post-treat a surface of the semiconductor substrate to remove the inhibitor layer.

In a third aspect, the present disclosure encompasses an apparatus for selective deposition. In one embodiment, the apparatus includes: a first processing chamber having a first substrate holder; a second processing chamber having a second substrate holder; a transfer module configured to transfer a semiconductor substrate from the first processing chamber to the second processing chamber; one or more gas inlets for flowing gases into the first and second processing chambers; a vacuum source for removing gases from the first and/or second processing chambers; a plasma generator for generating a plasma within the first and/or second processing chamber; and one or more controllers including machine-readable instructions for operating the one or more gas inlets, vacuum source, and plasma generator to deposit onto the semiconductor substrate.

In one embodiment, the machine-readable instructions of the one or more controllers includes instructions for:

(a) causing operation of the plasma generator to provide a plasma to the first processing chamber to pre-treat a surface of the semiconductor substrate;

(b) causing operation of the one or more gas inlets to flow an inhibitor into the first processing chamber and provide an inhibitor layer on a first region (also referred to as the exposed metal surface herein) of a semiconductor substrate held in the substrate holder, wherein the first region includes a metal, wherein the semiconductor substrate further includes a second region (also referred to as the dielectric material herein) including a different material than the first region;

(c) causing operation of the vacuum source to remove at least some of the inhibitor from the first processing chamber;

(d) optionally causing operation of the first substrate holder to anneal the inhibitor layer at a temperature of from about 250° C. to 350° C.;

(e) causing operation of the transfer module to transfer the semiconductor substrate from the first processing chamber to the second processing chamber;

(f) optionally causing operation of the second substrate holder to anneal the inhibitor layer at a temperature of from about 250° C. to 350° C.;

(g) causing operation of the one or more gas inlets to flow a first precursor to the second processing chamber to deposit a first layer on at least a portion of a non-inhibited surface including the second region;

(h) optionally causing operation of the one or more gas inlets to flow a second precursor to the second processing chamber to further deposit a second layer on at least a portion of a surface of the first layer or the non-inhibited surface; and (i) optionally causing operation of the plasma generator, after (g) or (h), to provide a plasma to the second processing chamber to post-treat a surface of the semiconductor substrate to remove the inhibitor layer.

In any embodiment herein, the inhibitor layer includes a self-assembled monolayer or a self-assembled multilayer.

Examples are disclosed that relate to delivering a low vapor pressure chemical to a processing chamber of a processing tool. One example provides a chemical vapor deposition (CVD) tool comprising a processing chamber. The chemical vapor deposition tool further comprises a processing gas outlet configured to introduce one or more processing gases into the processing chamber. The chemical vapor deposition tool further comprises an ampoule comprising a flow-over-vapor (FOV) gas inlet and a FOV gas outlet. The chemical vapor deposition tool further comprises a mass flow controller configured to control a flow of a carrier gas through the FOV gas inlet. The chemical vapor deposition tool further comprises an ampoule heater. The chemical vapor deposition tool further comprises one or more heated gas lines that lead from the FOV gas outlet of the ampoule to the processing gas outlet. The chemical vapor deposition tool further comprises a controller configured to control operation of the chemical vapor deposition tool.

In some such examples, the CVD tool further comprises an inhibitor in the ampoule, wherein the inhibitor comprises a vapor pressure of 10 torr or lower at a temperature of 60° C.

In some such examples, the controller additionally or alternatively is configured to flow the inhibitor through the one or more heated gas lines at a flow rate within a range of 20 to 500 standard cubic centimeters per minute (sccm).

In some such examples, the controller additionally or alternatively is configured to control the ampoule heater to heat the inhibitor to a temperature within a range of 80° C. to 100° C. during a deposition process.

In some such examples, the controller additionally or alternatively is configured to control one or more gas line heaters to heat the one or more heated gas lines to a temperature within a range of 100° C. to 130° C. during a deposition process.

In some such examples, the gas line heaters additionally or alternatively comprise one or more of a jacket heater, ribbon heater, or a molded heater.

In some such examples, the CVD tool additionally or alternatively comprises one or more heated divert gas lines that lead from the one or more heated gas lines to an exhaust system.

In some such examples, the controller additionally or alternatively is configured to control the mass flow controller to flow Nh gas through the FOV gas inlet into the ampoule.

In some such examples, the ampoule additionally or alternatively comprises a bulkfill port for refilling the ampoule with a liquid processing chemical.

In some such examples, the CVD tool additionally or alternatively comprises a primary power supply and an auxiliary power supply, the auxiliary power supply configured to power the one or more ampoule heaters and the one or more gas line heaters.

Another example provides a method of operating a chemical vapor deposition tool comprising a processing chamber. The method comprises heating an ampoule comprising an inhibitor in a liquid phase. The method further comprises controlling a flow of a carrier gas into the ampoule. The method further comprises heating one or more gas lines that extend from the ampoule to the processing chamber. The method further comprises, while heating the one or more gas lines, flowing the carrier gas with the inhibitor through the one or more gas lines into the processing chamber to deposit the inhibitor onto a metal surface of a substrate disposed in the processing chamber.

In some such examples, the inhibitor deposits at a first concentration onto the metal surface of the substrate and a second concentration onto an intermetal dielectric surface of the substrate. The second concentration is lower than the first concentration.

In some such examples, heating the ampoule additionally or alternatively comprises heating the ampoule to a temperature within a range of 80° C. to 100° C.

In some such examples, heating the one or more gas lines additionally or alternatively comprises heating the one or more heated gas lines to a temperature within a range of 100° C. to 130° C.

In some such examples, controlling the flow of the carrier gas additionally or alternatively comprises controlling a flow of $N_2$.

In some such examples, the method additionally or alternatively comprises heating one or more divert gas lines that lead from the one or more heated gas lines to an exhaust system.

Another example provides an ampoule assembly for a chemical vapor deposition tool. The ampoule assembly comprises an ampoule configured to hold a liquid inhibitor. The ampoule comprises a flow-over-vapor (FOV) gas inlet comprising a mass flow controller for controlling a flow of a carrier gas into the ampoule. The ampoule further comprises a FOV gas outlet. The ampoule further comprises a bulkfill port configured for refilling the ampoule with the liquid inhibitor. The ampoule further comprises one or more liquid level sensors configured to sense a level of the liquid inhibitor in the ampoule. The ampoule assembly further comprises one or more ampoule heaters configured to heat the ampoule.

In some such examples, the ampoule assembly further comprises a heated gas line and one or more gas line heaters configured to heat the heated gas line.

In some such examples, the ampoule assembly additionally or alternatively comprises an auxiliary power supply configured to power the one or more ampoule heaters and the one or more gas line heaters.

In some such examples, the heated gas line additionally or alternatively extends from the FOV gas outlet to a processing gas outlet of a processing chamber of the chemical vapor deposition tool.

Another example provides an apparatus for selective metal oxide deposition. In some examples, the apparatus includes a processing chamber; a substrate holder in the processing chamber; one or more processing gas outlets for flowing gases into the processing chamber; a vacuum source for removing gases from the processing chamber; an ampoule assembly; a plasma generator for generating a plasma within the processing chamber; and one or more controllers including machine-readable instructions for operating the one or more processing gas outlets, vacuum source, and plasma generator to deposit onto a semiconductor substrate, the machine-readable instructions of the one or more controllers comprising instructions for: (a) causing operation of the plasma generator to provide a plasma generated from a hydrogen-containing source and an oxygen-containing source to generate hydroxy species to pretreat a surface of the semiconductor substrate; and (b) causing operation of the one or more processing gas outlets to flow an inhibitor into the processing chamber and provide an inhibitor layer on a first region of a semiconductor substrate held in the substrate holder, wherein the first region includes a metal or a semiconductor, wherein the semiconductor substrate further includes a second region comprising a different material than the first region; wherein the ampoule assembly includes an ampoule configured to hold a liquid inhibitor.

In some such examples, the ampoule assembly includes a flow-over-vapor (FOV) gas inlet including a mass flow controller for controlling a flow of a carrier gas into the ampoule, a FOV gas outlet, a bulkfill port configured for refilling the ampoule with the liquid inhibitor, and one or more liquid level sensors configured to sense a level of the liquid inhibitor in the ampoule; one or more ampoule heaters configured to heat the ampoule; and one or more heated gas lines that lead from the FOV gas outlet of the ampoule to the one or more processing gas outlets.

These and other aspects are described further below with reference to the drawings.

BRIEF DESCRIPTION OF THE DRAWINGS

FIG. 4 shows OES wavelengths of O, H, and OH species.

DETAILED DESCRIPTION

The present disclosure relates to a method of selectively depositing metal oxide on an exposed metal surface relative to a dielectric material on a substrate. In some embodiments, the methods include low-temperature pre-treatment with a hydroxy species-generating plasma prior to inhibition of the metal surface and subsequent metal oxide deposition on the dielectric material.

The processes herein can provide protection of an exposed metal oxide surface with an inhibitor layer, thereby providing an inhibited surface. In this way, the inhibited surface is blocked from subsequent deposition steps, which can provide a deposited layer on the non-inhibited surface of the dielectric material. Just as the exposed metal surface is selectively inhibited, the dielectric material is selectively deposited with a layer (e.g., an oxide layer, a nitride layer, a carbide layer, or others described herein). Subsequent steps can include opening up the metal surface again (e.g., by removing the inhibitor layer), patterning the substrate to provide access to only the exposed metal surface, and depositing a metal within the pattern to provide a patterned via that is electrically connected to the metal surface. If the exposed metal surface includes a metal line, then the patterned via can provide an electrical contact to that line.

In other non-limiting embodiments, the selective deposition processes herein can reduce the RC delay and improve device performance. In further embodiments, the processes herein can reduce EUV lithography steps, as well as save time and potentially cost.

Figure 1:
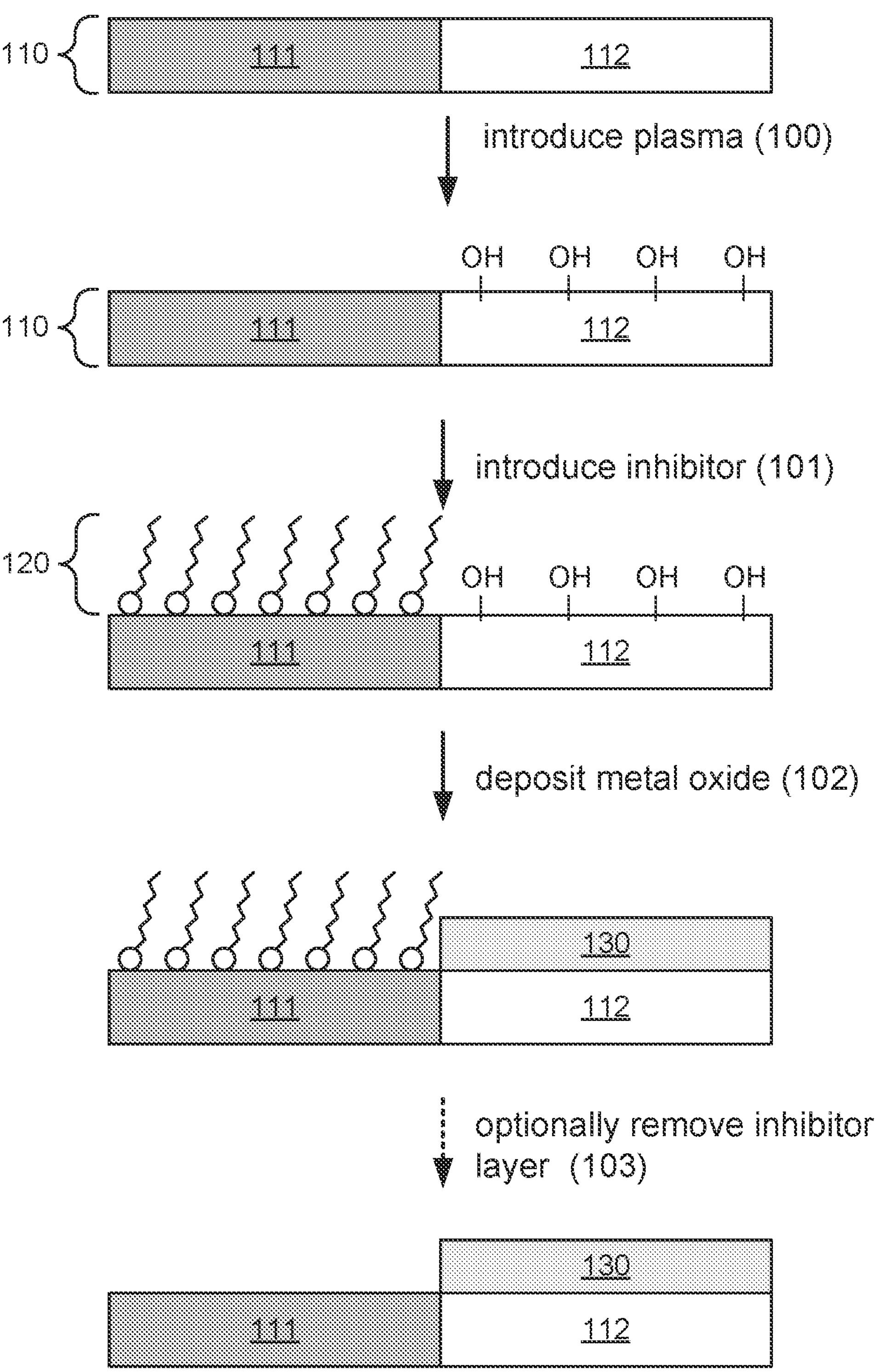
FIG. 1 provides a schematic of non-limiting operations for selective deposition.

FIG. 1 schematically shows a non-limiting process for selective deposition. As can be seen, the substrate 110 includes an exposed metal surface (first region) 111 and a dielectric material (second region) 112 that is different from the first region 111 and in proximity to the first region 111. In one embodiment, the first region 111 includes a conductive material (e.g., a metal), and the second region 112 includes a semi- or non-conductive material (e.g., a semiconductor or a dielectric). In another embodiment, the first region 111 includes a semi-conductive material, and the second region 112 includes a non-conductive material.

Non-limiting conductive materials can include a metal, such as a transition metal, including cobalt (Co), copper (Cu), tungsten (W), ruthenium (Ru), tantalum (Ta), titanium (Ti), hafnium (Hf), zirconium (Zr), and/or molybdenum (Mo), as well as combinations thereof and doped forms thereof. Non-limiting semi-conductive materials include silicon (Si), germanium (Ge), silicon germanium (SiGe), germanium silicon (GeSi), doped Si, doped Ge, and, in some instances, silicon carbide. Non-limiting non-conductive materials can include a non-metal or a dielectric, such as a low-κ dielectric. Examples of low-κ dielectrics include those having a relative dielectric constant (κ) of less than about 4.0 or less than about 3.0, as well as from about 2.0 to 4.0, 2.0 to 2.0, 2.5 to 4.0, or 2.5 to 3.0. Low-K dielectrics include silicon dioxide ($SiO_2$), including doped $SiO_2$ (e.g., carbon-doped oxide (CDO) or carbon-doped $SiO_2$), porous $SiO_2$, porous doped $SiO_2$ (e.g., porous CDO), silicon nitride, silicon carbide in some instances, silicon oxycarbide, silicon oxynitride, silicon carbon nitride, etc.

Turning again to FIG. 1, the process can include contacting 100 substrate 110 with a plasma source, introducing 101 an inhibitor such as a silicon-containing inhibitor, depositing 102 a material, and optionally removing 103 the inhibitor layer. Each of these operations are discussed in turn. In operation 100, a low-temperature hydrogen and oxygen-based plasma pre-treatment cleans the exposed metal surface while protecting the dielectric material. In operation 101, the inhibitor is then introduced to the surface of the substrate 110. Due to the affinity of the inhibitor molecule to the first region 111, an inhibitor layer 120 is selectively provided on the first region 111. Most of the second region 112 is free from the inhibitor, thus providing a non-inhibited surface.

The inhibitor layer 120 can be characterized by its position, e.g., being disposed by its proximity to the first region as compared to the second region. When a silicon-containing inhibitor is utilized, the inhibitor layer can also be characterized by the orientation of the silicon-containing inhibitor. As seen in FIG. 1, an exemplary silicon-containing inhibitor is characterized by a head group (circle) and a tail group (line), in which the head group is in proximity to the surface of the first region 111. Not every inhibitor molecule needs to be oriented in such a fashion, and the inhibitor layer can include an ordered layer with precise head group orientation to the surface of the first region or a disordered layer with some but not all head groups oriented in the same direction.

Furthermore, the inhibitor layer can be a monolayer (a single layer of the molecules, including an ordered or disordered monolayer) or a multilayer (more than one layer of the molecule, including ordered or disordered bilayer or other multilayers). Within a multilayer, each layer be oriented in any useful manner, such as a first layer with head groups primarily oriented towards the surface of the first region, and a second layer disposed above the second layer with its tail groups oriented towards the tail groups of the first layer. Such multilayer can have any useful configuration of layers and silicon-containing inhibitors that can be envisaged to minimize energetic interactions during a self-assembly process.

Properties of the inhibitor layer can be characterized by its mass change, which can indicate the number of intact or cleaved inhibitor molecules; its water contact angle (WCA), which can indicate the density or packing of the layer(s); and/or its C—H bending or stretching modes using FTIR, can indicate the density or packing of the layer(s). In one embodiment, the inhibitor layer is characterized by a WCA of more than about 100° C. or from about 100° C. to 120° C.

The inhibitor (e.g., any described herein) can be introduced to the surface with useful process conditions. In one embodiment, a silicon-containing inhibitor is provided to the chamber with a dose time of about 5 seconds to 600 seconds and/or at a temperature of about 50° C. to 400° C. or 50° C. to 100° C. and/or a pressure of about 5 Torr to 10 Torr. In particular embodiments, the silicon-containing inhibitor is provided with an inert carrier gas (e.g., nitrogen ($N_2$) gas), the silicon-containing inhibitor is heated between 50° C.-100° C. and the process pressure range is 5-10 Torr. Delivery of the inhibitor to the chamber can be continuous or in pulses. Additional process conditions are described herein.

As seen in FIG. 1, operation 102 includes depositing a material 130 on the second region 112. In one embodiment, the material 130 is provided as a layer. As used herein, selective deposition can mean selectively depositing an inhibitor on a first region and/or selectively depositing a material on a second region. The material 130 is selectively deposited on the second region 112 because the inhibitor layer 111 blocks deposition; which process efficiency is enhanced by plasma pre-treatment.

The material can be deposited using a vapor-based deposition process, such as ALD, CVD, as well as plasma-enhanced forms thereof. Non-limiting materials include non-conductive material, such as an insulator, as well as an oxide, a metal oxide, a nitride, a metal nitride, a carbide, a metal carbide, or an oxynitride. Examples of materials include aluminum oxide, zinc oxide, zirconium oxide, hafnium oxide, gallium oxide, cerium oxide, indium oxide, silicon oxide, silicon oxynitride, silicon nitride, or titanium oxide. Layers of material can be deposited using a plurality of cycles (e.g., 10, 100, 200, or more cycles). Other conditions can include a deposition time of about 5 seconds to 600 seconds and/or at a temperature of about 25° C. to 500° C. and/or a pressure of about 10 mTorr to 10 Torr.

Turning again to FIG. 1, operation 103 is optional and can include removing the inhibitor layer from the first region 111. In this way, the substrate can be further processed to provide a connection that is physically or electrically connected to the first region. For instance, if the first region 111 is a metal line, then removing the inhibitor layer 120 can allow for depositing a metal via that is electrically connected to the metal line and electrically insulated from contact with other metal lines within the substrate by the presence of the selectively deposited material 130.

Operation 100 includes pre-treating the surface of the semiconductor substrate having an exposed metal surface and a dielectric material. Pre-treating provides an activated surface that promotes selective deposition of the silicon-containing inhibitor on the exposed metal surface. Non-limiting pre-treatment processes include plasma treatment or reducing plasma treatment. Plasma treatment can include inductively coupled plasma (ICP) or capacitively coupled plasma (CCP). In one embodiment, treatment includes an CCP plasma source with the plasma gas being hydrogen ($H_2$) gas and oxygen ($O_2$) gas in helium gas (e.g., at a power of from about 100 W to about 5000 W). Non-limiting conditions include a treatment time of from about 1 second to about 10 seconds and/or a substrate temperature of from about 50° C. to about 200° C. In yet another embodiment, treatment includes a CCP plasma source with the plasma gas being ammonia ($NH_3$) gas (e.g., at a power of about 100 W). Non-limiting conditions include a treatment time of about 10 seconds to 60 seconds and/or a substrate temperature of about 200° C. to 300° C.

In some embodiments, the plasma may comprise an oxygen-based plasma as the oxygen-containing source including oxygen atoms, oxygen radicals, oxygen reactive species, oxygen plasma or combinations thereof. In some embodiments, the plasma may comprise a hydrogen-based plasma as the hydrogen-containing source including hydrogen atoms, hydrogen radicals, hydrogen reactive species, hydrogen plasma or combinations thereof. In some embodiments, the plasma may also comprise noble gas species, for example argon, neon, krypton, xenon or helium species. In some instances, the plasma may comprise other species, for example, nitrogen atoms, nitrogen radicals, nitrogen plasma or combinations thereof.

In some embodiments the substrate is contacted with a reactant comprising hydrogen, oxygen, and helium plasma. In some embodiments the ratio of oxygen gas to hydrogen gas is from about 0.25:1 to about 3:1. In some embodiments the ratio of oxygen gas to hydrogen gas is 1:1. In some embodiments, the ratio of oxygen gas to hydrogen gas is greater than 1:1, for example, at least 1.25:1, 1.5:1, or 2:1. As discussed below, this can suppress the generation of H species. In some embodiments the ratio of oxygen gas to hydrogen gas is 2:1.

The plasma may be formed in a reaction chamber or upstream of a reaction chamber, for example by flowing the hydrogen, oxygen and helium through a remote plasma generator. Alternatively, hydrogen and helium plasma may be fed into a reaction chamber separately from oxygen and helium plasma. In some embodiments of the plasma pre-treatment, the hydrogen gas is supplied in a volume of from about 500 to about 5000 sccm (standard cubic centimeters/minute). In some embodiments of the plasma pre-treatment, the oxygen gas is supplied in a volume of from about 500 to about 5000 sccm. In some embodiments of the plasma pre-treatment, the helium gas is supplied in a volume of from about 1000 to about 10,000 sccm. In some embodiments, helium may be omitted. In some embodiments, another inert gas may be used instead of or in addition to helium.

In an embodiment, the substrate is contacted with a plasma generated from a hydrogen-containing source and an oxygen-containing source under conditions wherein hydroxy species are formed in the absence of oxygen and hydrogen reactive species. The hydroxy species may be a hydroxyl group (OH radical) or a hydroxide (OH ion). In some embodiments, the plasma may include radicals and/or ions. In an embodiment, hydroxy species are the only reactive species present. The formation solely of hydroxy species during plasma pre-treatment provides a two-fold advantage during the process of formation of thin films by creating a freshly oxidized exposed metal surface which enables improved inhibitor absorption; while concurrently modifying the dielectric material with hydroxy groups, thus preparing the dielectric material for a decreased nucleation delay when a metal oxide is deposited.

In some embodiments, a plasma having hydroxy species is formed using an in sint CCP plasma source. Oxygen and hydrogen may be co-flowed or introduced separately to the chamber as described above. Helium or another noble gas may be co-flowed or introduced separately as described above. Example flow rates are given above. In some embodiments, the CCP plasma source uses a high frequency radio frequency (HFRF) source. The HFRF source may operate at 13.56 MHz. In some embodiments, 27.1 MHz may be used. Example HFRF powers range from 200 W to 1000 W, per single station. Example chamber pressures range from 1 to 10 Torr. Substrate temperatures may be from 50° to 200° C.

The inhibitor can be deposited at a temperature of about 100° C. to 400° C., a pressure of about 1 to 10 Torr, a flow range of about 1 to 10 slm, and with an inert carrier gas (e.g., $N_2$). The inhibitor layer can be further treated, e.g., annealed at a temperature of from about 250° C. to 350° C. and, optionally, for a period of about 10 seconds to 360 seconds.

Without wishing to be limited by mechanism, such an annealing step can provide an ordered layer, which may be beneficial for selective deposition of the metal oxide on the second region.

After depositing the metal oxide, further layers can be disposed on at least a portion of a surface of the metal oxide. Such further layers can serve as an etch stop layer, a diffusion barrier layer, a capping layer, a liner layer, etc. Non-limiting further layers can include a dielectric (e.g., any described herein), tantalum (Ta), or tantalum nitride ($Ta_xN_y$).

The process includes optionally post-treating the surface to remove the inhibitor layer from the first region. Such post-treatment can include plasma treatment, wet etchant chemistry, dry etchant chemistry, or combinations thereof. Such post-treatment processes can include those that minimize damage to the first region. In another embodiment, treatment includes an ICP or CCP plasma source with the plasma gas being hydrogen ($H_2$) gas or ammonia ($NH_3$) gas. Non-limiting conditions include a treatment time of about 30 seconds to 360 seconds and/or a substrate temperature of about 100° C. to 300° C.

The process optionally additionally includes providing a patterned via that is electrically connected to the first region. Such a via can be provided by using a patterned mask and depositing a metal within open features within the mask to provide a metal connection that is electrically connected to the first region.

Figure 2:
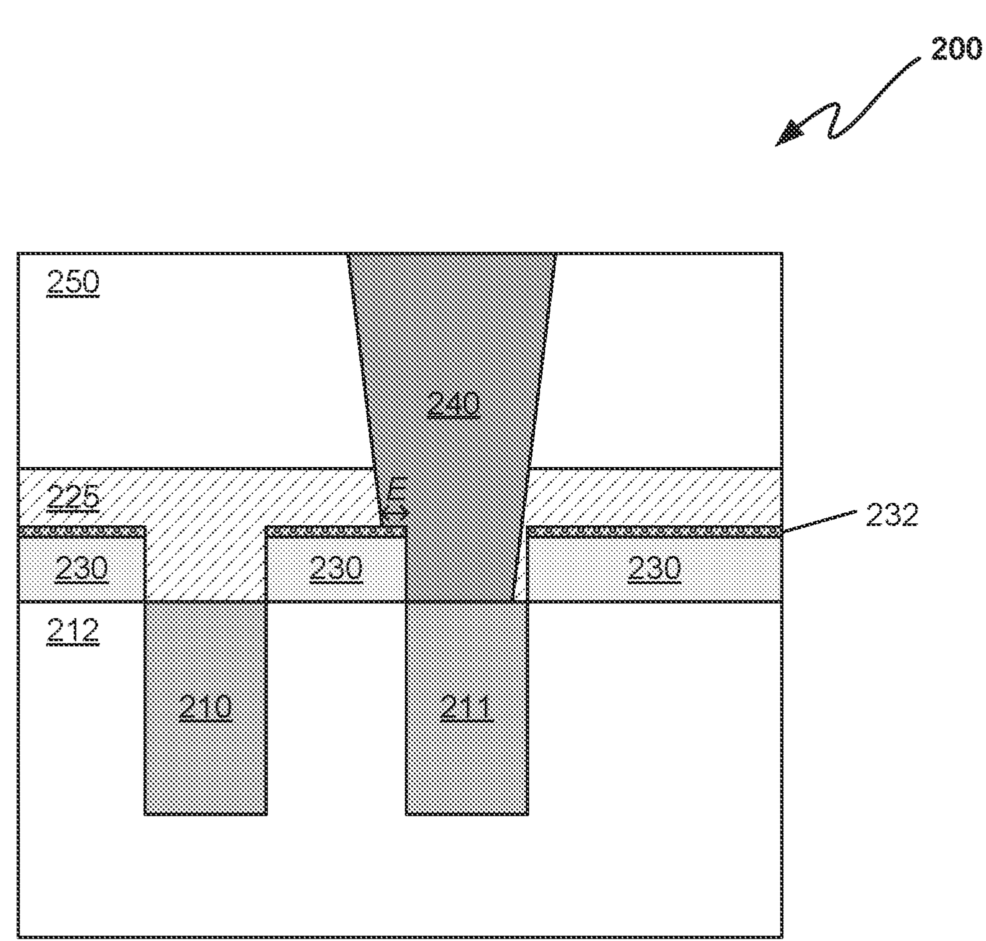
FIG. 2 provides a schematic of a non-limiting stack.

FIG. 2 provides an exemplary stack 200 formed by using the processes described herein. As can be seen, the stack 200 includes a substrate having metal lines 210, 211 surrounded by a dielectric 212. With the processes herein, the metal lines 210, 211 can serve as the first region upon which an inhibitor layer can be deposited; and the dielectric 212 can serve as the second region upon which a metal oxide 230 can be deposited. Optionally, a further layer 232 can be deposited on at least a portion of the surface of the metal oxide. Further patterning can provide a metal via 240 that is electrically connected to one metal line 211, a capping layer 225, and a further dielectric layer 250. The distance between the intended and actual position on the feature edge of the metal via 240 can be characterized by an edge placement error, as indicated in FIG. 2 by E.

Processing conditions can be optimized based on the composition and chemical characteristics of the silicon-containing inhibitor and the deposited metal oxide. For instance, deposition of the silicon-containing inhibitor can be characterized by mass change and/or a water contact angle (WCA) at various pedestal temperatures (e.g., from 120° C. to 300° C.) or pressure (e.g., from 5 to 10 Torr). In particular embodiments, a WCA of about 100° or more can be obtained. Other studies can include chemical characterization of the inhibitor layer, such as by Fourier-transform infrared spectroscopy (FTIR), transmission electron microscopy (TEM), cross-sectional transmission electron microscopy (XTEM), and/or energy-dispersive X-ray spectroscopy (EDS).

Figure 3:
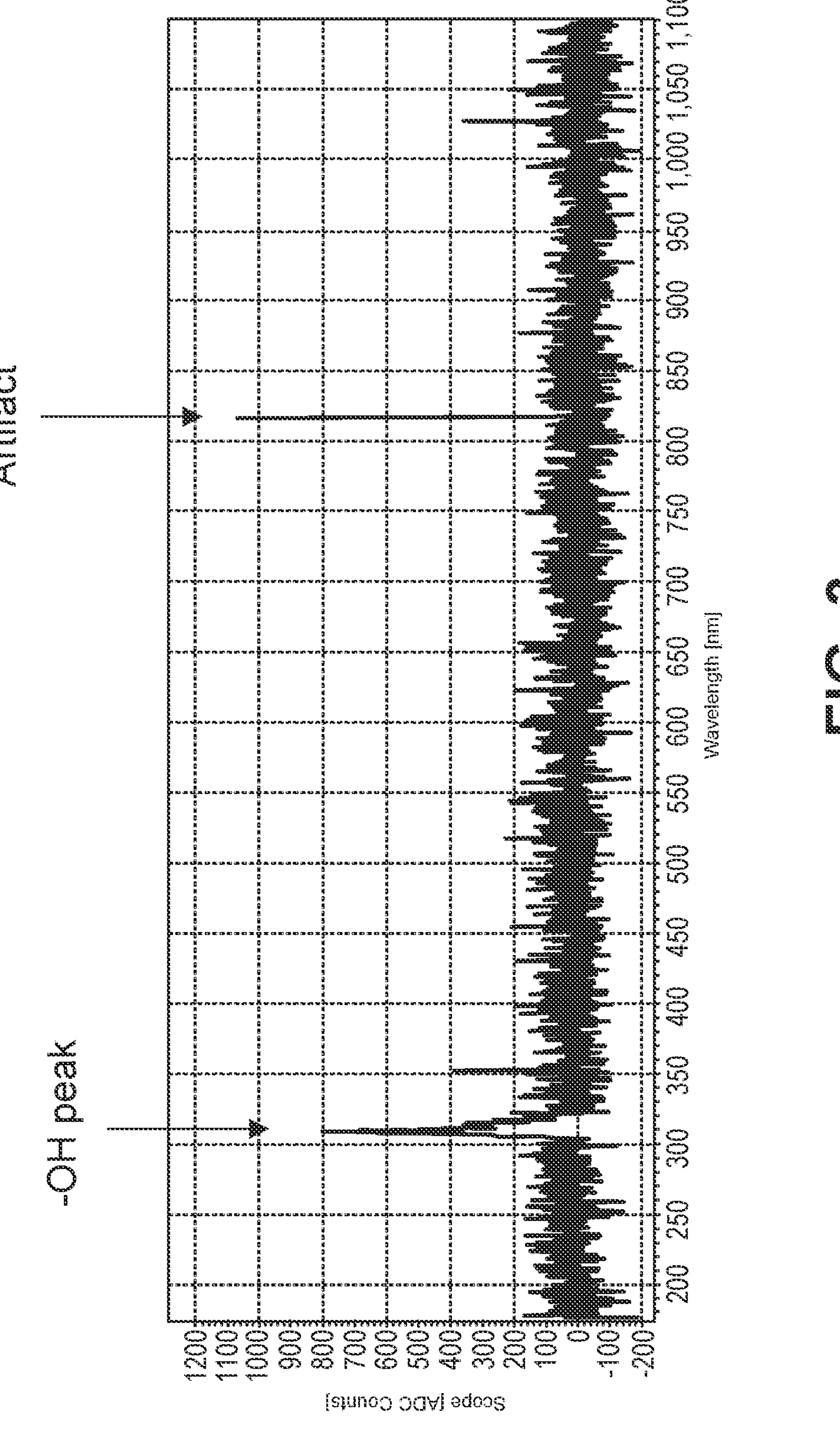
FIG. 3 shows optical emission spectroscopic (OES) data confirming the presence of hydroxy species.

FIG. 3 provides OES spectroscopic analysis of the plasma pre-treatment step with a hydrogen-containing source and an oxygen-containing source which confirmed the presence of hydroxyl radicals and absence of hydrogen radicals and oxygen radicals, under the conditions of 1 kW power, a pressure of 6 Torr, $H_2$ at 1000 sccm and $O_2$ at 2000 sccm.

FIG. 4 is a table showing wavelengths corresponding to OH, O, and H species in the spectroscopic analysis of FIG. 3. The strong presence of an OH species and absence of oxygen or hydrogen reactive species is illustrated by the peak at a wavelength of 309.

In some embodiments, a plasma having hydroxy species with substantially no hydrogen and oxygen species is generated. Substantially no species refers to no signal above noise on a spectroscopic analysis as shown in FIG. 3. Still further, in some embodiments, some small number of H and/or O species may be tolerated with the greatest number of species being hydroxyl species.

While the parameters used to generate such a plasma having substantially no (or a reduced number of) H or O species may differ depending on the particular plasma source and chamber, chamber pressure, reactant flow rates, and plasma power can be controlled to generate a plasma having hydroxy species with substantially no hydrogen and oxygen species. For example, increasing plasma power (holding pressure and flow rates constant) can lead to an increase in H species. Reducing H flow (holding pressure, $O_2$ flow rate, and power constant) can lead to a decrease in H species. Increasing pressure at low $H_2$ flow and lower power can decrease H species. Increasing $O_2$ (while keeping all other parameters constant) also leads to the reduction in H species generation in the plasma.

Inhibitors

The inhibitors may be sulfur-containing compounds, phosphorus-containing compounds or silicon-containing compounds.

When the inhibitor is silicon-containing, it can be used for form silicide bonds preferentially on certain surfaces, such as those having a metal or a semiconductor, thereby forming inhibited surfaces. The remaining non-inhibited surfaces can then be further treated or processed in a selective manner. For instance, although a material can be provided to the entire surface, deposition of that material will occur on the exposed, non-inhibited surface.

Without wishing to be limited by mechanism, use of a silicon-containing inhibitor (or silane) for a selective deposition process has certain advantages over other purposed methods, as the silicon-containing inhibitor layer does not damage the surface onto which it deposits. Silane provides an additional advantage in terms of ease of deposition and removal, along with associated low cost. These factors can be advantageous because damaging metal could increase the resistance of that metal line or via. This, in turn, could slow down electronic device switching speeds. Furthermore, at sufficiently high temperatures, silanes can react with a metal or metalloid surface to form silicide bonds. Such bonds can provide a more stable layer, as compared to an inhibitor attached by way of van der Waals or other weak forces. In turn, this stability can provide an inhibitor layer that resists desorption during deposition, reduces nucleation of a material on the inhibited surface, and enhance selectivity.

Deposition occurs on a non-inhibited, non-metal surface (e.g., a dielectric surface). In particular, deposition can include introduction of a selective metal oxide thin film, which can be deposited on an interlayer dielectric (ILD) to increase the distance between metal via and metal lines and reduce the contact. This additional topography created by selective deposition of a dielectric on a dielectric surface can create extra spacing between the fabricated via and neighboring metal line, which can improve the device performance and reduce the RC delay.

Once the metal surface is inhibited by a silane, it acts as an inhibitor to block deposition on metal lines. A thin inhibitor layer (e.g., as a monolayer or a multilayer) is thermally deposited on a metal region of the substrate but not on a non-metal region in proximity to the metal region. This non-metal region can include a semiconductor or a dielectric. Then, a material is deposited on the substrate (or wafer). Due to the presence of the inhibitor layer, the material is deposited primarily on the non-metal region of the substrate. Deposition of the material can occur in a same or different processing chamber as that employed for providing the inhibitor layer. Optionally, the inhibitor layer can be removed after deposition of the material in any useful manner, such as by plasma treatment or other cleaning steps in the form of wet or dry etch processes. Similarly, rather than a metal surface, the silane can be used to inhibit a surface of a semiconductor material, as compared to a surface of a dielectric.

Sulfur-containing inhibitors can include any that have at least one S atom and at least one organic moiety. In one embodiment, the sulfur-containing inhibitor is an alkyl thiol such as butanethiol or dodecanethiol.

Phosphorus-containing inhibitors can include any that have at least one P atom and at least one organic moiety. In one embodiment, the phosphorus-containing inhibitor is an alkyl phosphonic acid such as octadecylphosphonic acid.

Silicon-containing inhibitors can include any that have at least one Si atom and at least one organic moiety. In one embodiment, the silicon-containing inhibitor includes at least one Si—H bond or group. In one embodiment, the silicon-containing inhibitors are alkyl amino silanes or alkylchlorosilanes. In another embodiment, the silicon-containing inhibitor includes at least three Si—H bonds and an organic moiety, i.e., $RSiH_3$, in which R is an organic moiety.

In one embodiment, the silicon-containing inhibitor includes a head group including one Si atom and a tail group including one organic moiety. In another embodiment, the head group is or includes $—SiH_3$ or $—SiH_2X^1$ or $—SiHX^1X^2$, in which each of $X^1$ and $X^2$ is, independently, selected from the group consisting of hydrogen (H), halo, optionally substituted aliphatic, optionally substituted cycloaliphatic, or optionally substituted aromatic. In particular embodiment, each of $X^1$ and $X^2$ is, independently, hydrogen (H), fluoro (F), chloro (Cl), bromo (Br), or iodo (I). In other embodiments, each of $X^1$ and $X^2$ is, independently, H, halo, or optionally substituted $C_{1-6}$ alkyl.

In other embodiments, the silicon-containing inhibitor is or includes $RSiHX^1X^2$, in which R is the organic moiety, and each of $X^1$ and $X^2$ is any described herein. In particular embodiment, each of $X^1$ and $X^2$ is, independently, H, F, Cl, Br, or I. In other embodiments, each of $X^1$ and $X^2$ is, independently, H, halo, or optionally substituted $C_{1-6}$ alkyl.

Non-limiting organic moiety (or R) can be or include optionally substituted aliphatic, optionally substituted heteroaliphatic, optionally substituted cycloaliphatic, optionally substituted cycloheteroaliphatic, or optionally substituted aromatic. In other embodiments, the organic moiety can be or include optionally substituted alkyl, optionally substituted alkenyl, optionally substituted alkynyl, optionally substituted heteroalkyl, optionally substituted heteroalkenyl, optionally substituted heteroalkynyl, optionally substituted cycloalkyl, optionally substituted cycloheteroalkyl, optionally substituted aryl, or optionally substituted heterocyclyl. Examples of substitutions for an organic moiety can include any described herein for alkyl or aryl. In particular embodiments, the organic moiety includes a branched-chain hydrocarbon. In other embodiments, the organic moiety includes an optionally substituted alkyl having one or more halo substitutions (e.g., one or more fluorine substitutions).

In other embodiments, the organic moiety is or includes —X-L-Z, and wherein:

X is a covalent bond, optionally substituted alkylene, optionally substituted alkenylene, optionally substituted alkynylene, optionally substituted alkyleneoxy, optionally substituted heteroalkylene, optionally substituted heteroalkenylene, optionally substituted heteroalkynylene, optionally substituted arylene, optionally substituted aryleneoxy, or optionally substituted heterocyclyldiyl;

L is a covalent bond, $—CR^1R^2—$, $—CR^1{=}CR^2—$, $—NR^1—$, —C(O)—, $—C(O)NR^1—$, $—NR^1C(O)—$, —C(O)O—, —OC(O)—, —S—, or —O—;

Z is H, optionally substituted alkyl, optionally substituted alkenyl, optionally substituted alkynyl, optionally substituted heteroalkyl, optionally substituted heteroalkenyl, optionally substituted heteroalkynyl, optionally substituted aryl, or optionally substituted heterocyclyl; and each of $R^1$ and $R^2$ is, independently, H or optionally substituted alkyl.

In some embodiments, X is optionally substituted alkylene; L is a covalent bond, $—CR^1R^2—$, $—CR^1{=}CR^2—$, $—NR^1—$, —C(O)—, $—C(O)NR^1—$, $—NR^1C(O)—$, —C(O)O—, —OC(O)—, —S—, or —O—; Z is H or optionally substituted alkyl; and each of $R^1$ and $R^2$ is, independently, H or optionally substituted $C_{1-6}$ alkyl.

In particular embodiments, the organic moiety includes 6 to 26 carbon atoms (e.g., 6 to 24, 6 to 20, 6 to 18, 8 to 26, 8 to 24, 8 to 20, 8 to 18, 10 to 26, 10 to 24, 10 to 20, or 10 to 18 carbon atoms) within a linear chain, branched chain, or cyclic group. Optionally, the organic moiety can be or include optionally substituted $C_{6-26}$ alkyl, optionally substituted $C_{6-26}$ alkenyl, optionally substituted $C_{6-26}$ alkynyl, optionally substituted $C_{6-26}$ heteroalkyl, optionally substituted $C_{6-26}$ heteroalkenyl, optionally substituted $C_{6-26}$ heteroalkynyl, optionally substituted $C_{6-26}$ cycloalkyl, optionally substituted $C_{6-26}$ cycloheteroalkyl, optionally substituted $C_{6-26}$ aryl, or optionally substituted $C_{6-26}$ heterocyclyl.

Non-limiting silicon-containing inhibitors include n-octadecylsilane ($C_{18}H_{40}Si$), tridecylsilane ($C_{13}H_{30}Si$), dodecylsilane ($C_{12}H_{28}Si$), undecylsilane ($C_{11}H_{26}Si$), decylsilane ($C_{10}H_{24}Si$), decan-4-ylsilane ($C_{10}H_{24}Si$), nonylsilane ($C_9H_{22}Si$), nonan-4-ylsilane ($C_9H_{22}Si$), octan-2-ylsilane ($C_8H_{20}Si$), octylsilane ($C_8H_{20}Si$), heptylsilane ($C_7H_{18}Si$), heptan-4-ylsilane ($C_7H_{18}Si$), (tridecafluoro-1,1,2,2-tetra-hydrooctyl)silane ($CsH_7F_{13}Si$), 10-undecenylsilane ($C_{11}H_{24}Si$), and others.

Apparatuses

Figure 5:
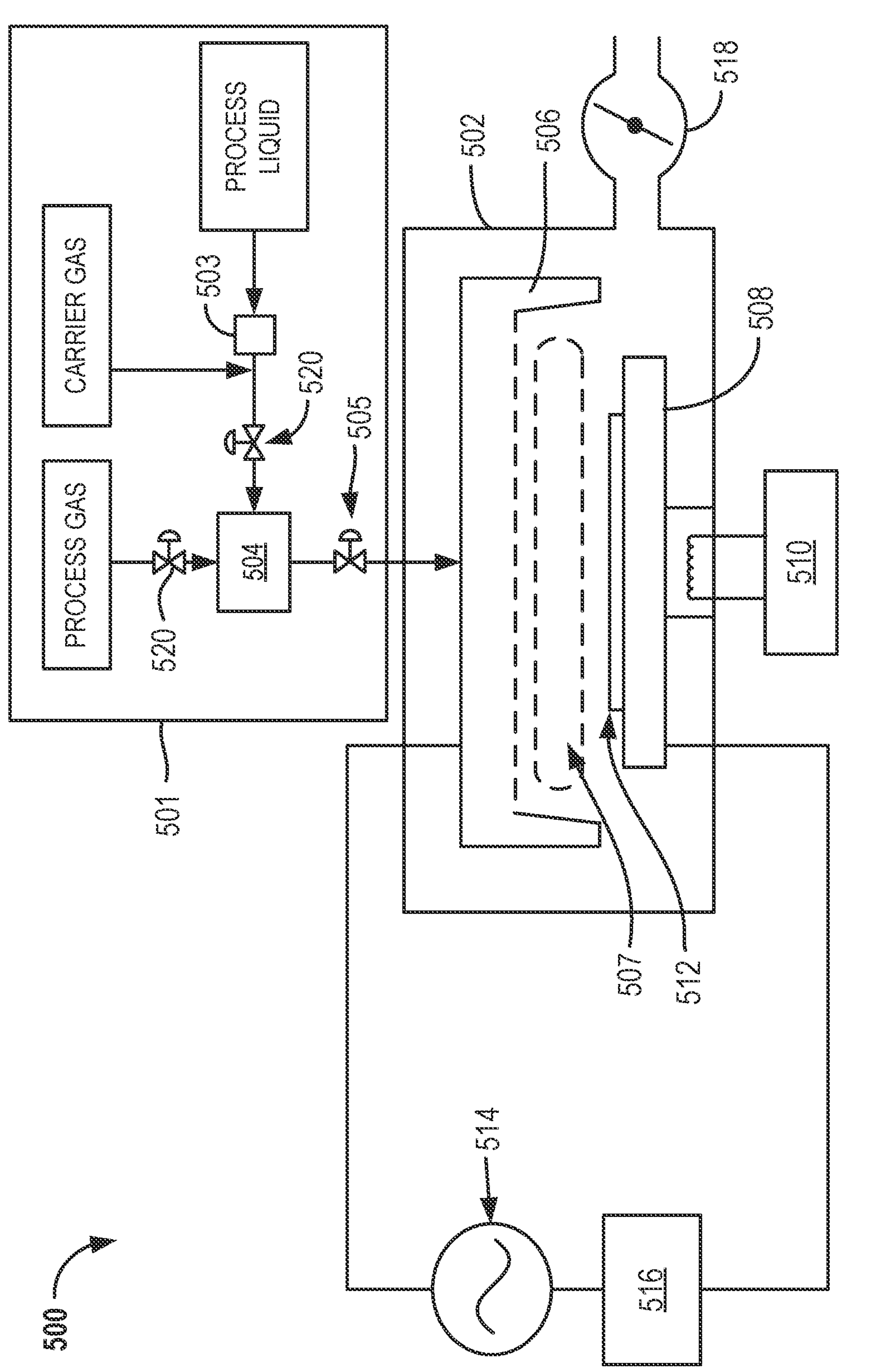
FIG. 5 shows a schematic illustration of an ALD or chemical vapor deposition (CVD) chamber suitable for practicing various embodiments.

FIG. 5 schematically shows an embodiment of a process station 500 that may be used to deposit material using atomic layer deposition (ALD) and/or chemical vapor deposition (CVD), either of which may be plasma enhanced. For simplicity, the process station 500 is depicted as a standalone process station having a process chamber body 502 for maintaining a low-pressure environment. However, it will be appreciated that a plurality of process stations 500 may be included in a common process tool environment. Further, it will be appreciated that, in some embodiments, one or more hardware parameters of process station 500, including those discussed in detail below, may be adjusted programmatically by one or more computer controllers.

Process station 500 fluidly communicates with reactant delivery system 501 for delivering process gases to a distribution showerhead 506. Reactant delivery system 501 includes a mixing vessel 504 for blending and/or conditioning process gases for delivery to showerhead 506. One or more mixing vessel inlet valves 520 may control introduction of process gases to mixing vessel 504. Similarly, a showerhead inlet valve 505 may control introduction of process gasses to the showerhead 506.

Some reactants, like bis(t-butylamino)silane (BTBAS), may be stored in liquid form prior to vaporization at and subsequent delivery to the process station. For example, the embodiment of FIG. 5 includes a vaporization point 503 for vaporizing liquid reactant to be supplied to mixing vessel 504. In some embodiments, vaporization point 503 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 503 may be heat traced. In some examples, mixing vessel 504 may also be heat traced. In one non-limiting example, piping downstream of vaporization point 503 has an increasing temperature profile extending from approximately 100° C. to approximately 150° C. at mixing vessel 504.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller upstream of vaporization point 503 may be provided for controlling a mass flow of liquid for vaporization and delivery to process station 500. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 506 distributes process gases toward substrate 512. In the embodiment shown in FIG. 5, substrate 512 is located beneath showerhead 506, and is shown resting on a pedestal 508. It will be appreciated that showerhead 506 may have any suitable shape, and may have any suitable number and arrangement of ports for distributing processes gases to substrate 512.

In some embodiments, a microvolume 507 is located beneath showerhead 506. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 508 may be raised or lowered to expose substrate 512 to microvolume 507 and/or to vary a volume of microvolume 507. For example, in a substrate transfer phase, pedestal 508 may be lowered to allow substrate 512 to be loaded onto pedestal 508. During a deposition process phase, pedestal 508 may be raised to position substrate 512 within microvolume 507. In some embodiments, microvolume 507 may completely enclose substrate 512 as well as a portion of pedestal 508 to create a region of high flow impedance during a deposition process.

Optionally, pedestal 508 may be lowered and/or raised during portions the deposition process to modulate process pressure, reactant concentration, etc., within microvolume 507. In one scenario where process chamber body 502 remains at a base pressure during the deposition process, lowering pedestal 508 may allow microvolume 507 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 508 may allow a plasma density to be varied during plasma activation and/or treatment cycles included in the deposition process. At the conclusion of the deposition process phase, pedestal 508 may be lowered during another substrate transfer phase to allow removal of substrate 512 from pedestal 508.

While the example microvolume variations described herein refer to a height-adjustable pedestal, it will be appreciated that, in some embodiments, a position of showerhead 506 may be adjusted relative to pedestal 508 to vary a volume of microvolume 507. Further, it will be appreciated that a vertical position of pedestal 508 and/or showerhead 506 may be varied by any suitable mechanism within the scope of the present disclosure. In some embodiments, pedestal 508 may include a rotational axis for rotating an orientation of substrate 512. It will be appreciated that, in some embodiments, one or more of these example adjustments may be performed programmatically by one or more suitable computer controllers.

Returning to the embodiment shown in FIG. 5, showerhead 506 and pedestal 508 electrically communicate with RF power supply 514 and matching network 516 for powering a plasma. In some embodiments, the plasma energy may be controlled by controlling one or more of a process station pressure, a gas concentration, an RF source power, an RF source frequency, and a plasma power pulse timing. For example, RF power supply 514 and matching network 516 may be operated at any suitable power to form a plasma having a desired composition of radical species. Examples of suitable powers are included above. Likewise, RF power supply 514 may provide RF power of any suitable frequency. In some embodiments, RF power supply 514 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 508 may be temperature controlled via heater 510. Further, in some embodiments, pressure control for deposition process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to process station 500.

Figure 6:
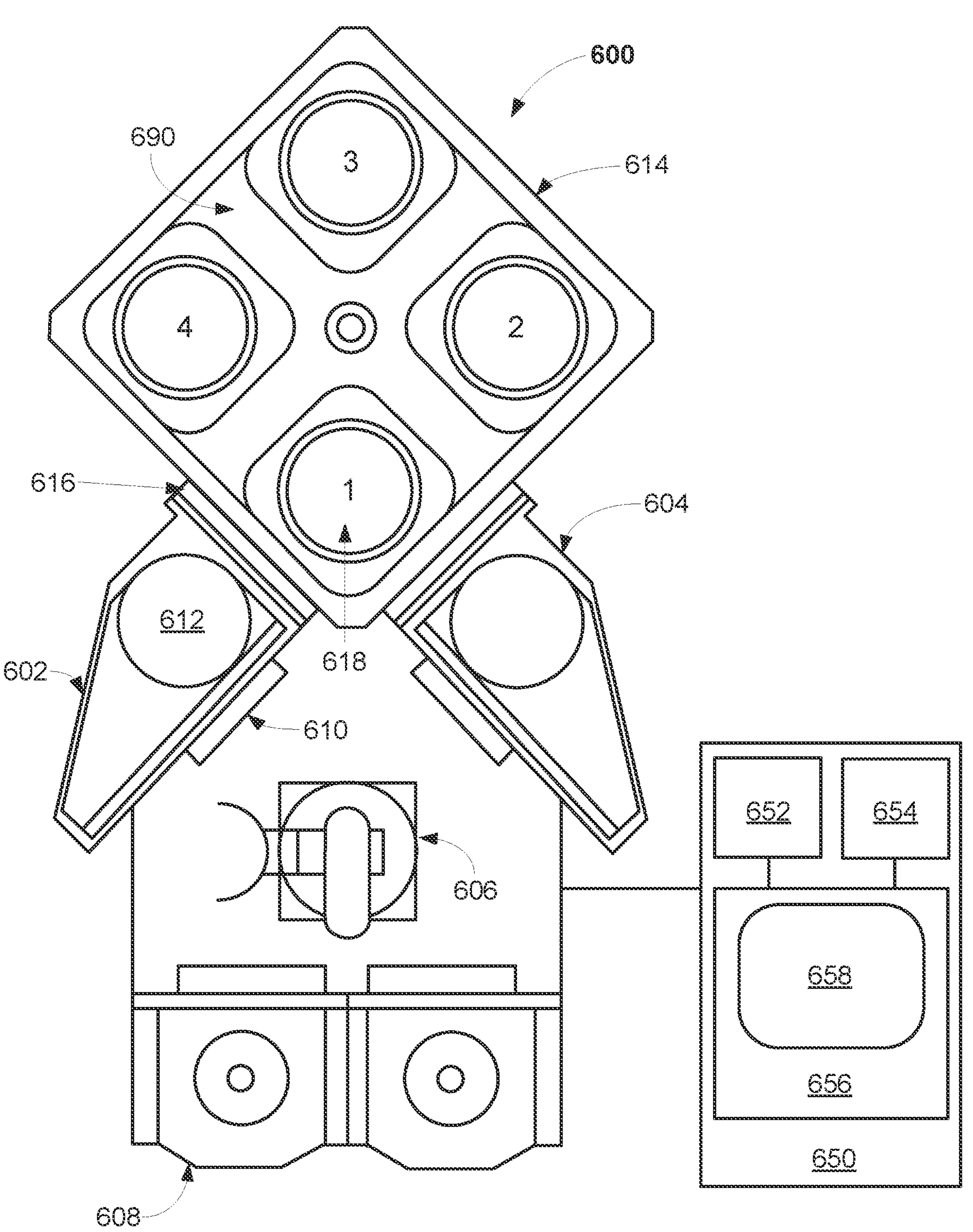
FIG. 6 shows another schematic illustration of another ALD or CVD chamber suitable for practicing various embodiments.

FIG. 6 shows a schematic view of an embodiment of a multi-station processing tool 600 with an inbound load lock 602 and an outbound load lock 604, either or both of which may comprise a remote plasma source. A robot 606, at atmospheric pressure, is configured to move wafers from a cassette loaded through a pod 608 into inbound load lock 602 via an atmospheric port 610. A wafer is placed by the robot 606 on a pedestal 612 in the inbound load lock 602, the atmospheric port 610 is closed, and the load lock is pumped down. Where the inbound load lock 602 comprises a remote plasma source, the wafer may be exposed to a remote plasma treatment in the load lock prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 614 comprises four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. While the depicted processing chamber 614 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 also depicts an embodiment of a wafer handling system 690 for transferring wafers within processing chamber 614. In some embodiments, wafer handling system 690 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog and/or digital input/output connections, stepper motor controller boards, etc.

In some embodiments, system controller 650 controls all of the activities of process tool 600. System controller 650 executes system control software 658 stored in mass storage device 654, loaded into memory device 656, and executed on processor 652. System control software 658 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes in accordance with the disclosed methods. System control software 658 may be coded in any suitable computer readable programming language.

In some embodiments, system control software 658 may include input/output control (IOC) sequencing instructions for controlling the various parameters described above. For example, each phase of a PEALD process may include one or more instructions for execution by system controller 650. The instructions for setting process conditions for a PEALD process phase may be included in a corresponding PEALD recipe phase. In some embodiments, the PEALD recipe phases may be sequentially arranged, so that all instructions for a PEALD process phase are executed concurrently with that process phase.

Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

Figure 7:
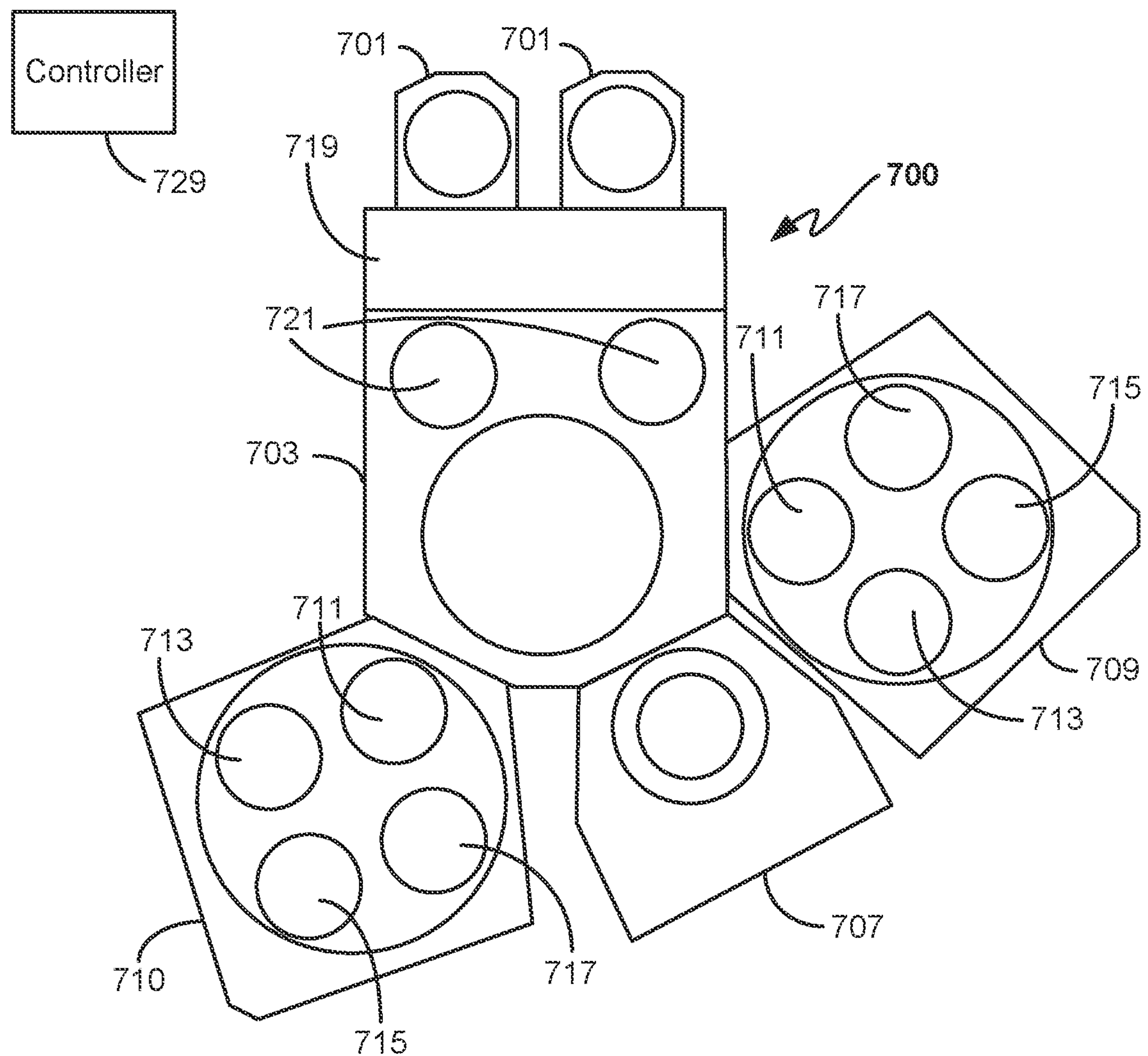
FIG. 7 shows a schematic illustration of a module cluster suitable for practicing various embodiments.

FIG. 7 is a block diagram of a processing system suitable for conducting thin film deposition processes in accordance with certain embodiments. The system 700 includes a transfer module 703. The transfer module 703 provides a clean, pressurized environment to minimize risk of contamination of substrates being processed as they are moved between various reactor modules. Mounted on the transfer module 703 are two multi-station reactors 709 and 710, each capable of performing atomic layer deposition (ALD) and/or chemical vapor deposition (CVD) according to certain embodiments. Reactors 709 and 710 may include multiple stations 711, 713, 715, and 717 that may sequentially or non-sequentially perform operations in accordance with disclosed embodiments. The stations may include a heated pedestal or substrate support, one or more gas inlets or showerhead or dispersion plate.

Also mounted on the transfer module 703 may be one or more single or multi-station modules 707 capable of performing plasma or chemical (non-plasma) pre-cleans, or any other processes described in relation to the disclosed methods. The module 707 may in some cases be used for various treatments to, for example, prepare a substrate for a deposition process. The module 707 may also be designed/configured to perform various other processes such as etching or polishing. The system 700 also includes one or more wafer source modules 701, where wafers are stored before and after processing. An atmospheric robot (not shown) in the atmospheric transfer chamber 719 may first remove wafers from the source modules 701 to loadlocks 721. A wafer transfer device (generally a robot arm unit) in the transfer module 703 moves the wafers from loadlocks 721 to and among the modules mounted on the transfer module 703.

In various embodiments, a system controller 729 is employed to control process conditions during deposition. The controller 729 will typically include one or more memory devices and one or more processors. A processor may include a CPU or computer, analog and/or digital input/output connections, stepper motor controller boards, etc.

The controller 729 may control all of the activities of the deposition apparatus. The system controller 729 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 729 may be employed in some embodiments.

Typically there will be a user interface associated with the controller 729. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 729. The signals for controlling the process are output on the analog and digital output connections of the deposition apparatus 700.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Flow-Over-Vapor Delivery System

As discussed above, chemical vapor deposition (CVD) involves exposing a substrate to a flow of one or more chemicals under conditions that cause the chemicals to form a deposited film on the substrate surface. Another deposition technique is atomic layer deposition (ALD). ALD forms a film using one or more deposition cycles. In an ALD cycle, a precursor gas is adsorbed onto a surface of a substrate disposed in a process chamber. Excess precursor is purged from the chamber, and the adsorbed precursor is chemically converted into a film on the substrate. Chemical conversion may involve exposure to another precursor gas and/or to energy from a plasma and/or a heater to cause a reaction that forms the film.

Some film deposition processes may use inhibitors to control film growth on the substrate. An inhibitor is a chemical that adsorbs to a substrate surface to inhibit subsequent growth of a film on the inhibited substrate surface. An inhibitor may adsorb selectively to some materials but not others, so that inhibition can be selectively applied to some surfaces but not others. For example, some inhibitors may selectively adsorb to metal surfaces of a substrate but not intermetal dielectric surfaces. The adsorbed inhibitor inhibits growth of the film on the metal surfaces while the film is grown on the intermetal dielectric surfaces.

In some instances, an availability of inhibitors with a desired selectivity may be limited. Selectivity may refer to a degree of preference for chemical adsorption onto a first surface in comparison to a second surface where adsorption is less favored. Further, an available inhibitor with the desired selectivity may have physical properties that pose challenges for deposition. For example, an inhibitor may be liquid at typical operating temperatures.

A flow-over vapor (FOV) delivery system can be used to deliver a liquid phase processing chemical. The processing chemicals may be reagents including, but not limited to, precursors and/or inhibitors which may be advantageously delivered into a processing chamber in this manner. However, a liquid inhibitor may have a relatively low vapor pressure. The deposition of such a processing chemical (inhibitor) may proceed relatively slowly due to the low vapor pressure. Further, the inhibitor vapor may condense to liquid phase on surfaces within the delivery system.

Accordingly, examples are disclosed that relate to delivering a low vapor pressure inhibitor or other processing chemical into a processing chamber of a CVD tool. Suitable inhibitors include, but are not limited to those described above. Examples of processing chemicals include trimethylaluminum, dimethylaluminum isopropoxide, dodecylsilane, tris(tert-pentoxy)silanol, tert-butyl alcohol and water. One example provides a CVD tool. The CVD tool comprises an ampoule. The ampoule is configured to hold an inhibitor in liquid phase with inhibitor vapor above the liquid surface. The CVD tool further comprises an ampoule heater to apply heat and thereby increase a vapor pressure of the inhibitor in the ampoule. The ampoule comprises a FOV gas inlet with a mass flow controller. The ampoule further comprises a FOV gas outlet. The CVD tool is configured to control the mass flow controller to flow a carrier gas through FOV gas inlet into the ampoule. In this manner, the carrier gas draws inhibitor vapor through the FOV gas outlet and through heated gas lines to the processing chamber. Such a CVD tool may help achieve relatively higher deposition rates of a low vapor pressure-inhibitor compared other CVD tools. Further, the heated gas lines help to prevent inhibitor from condensing within the gas lines. While discussed in the context of an inhibitor, the disclosed examples also are applicable to any other suitable processing chemical.

Figure 8:
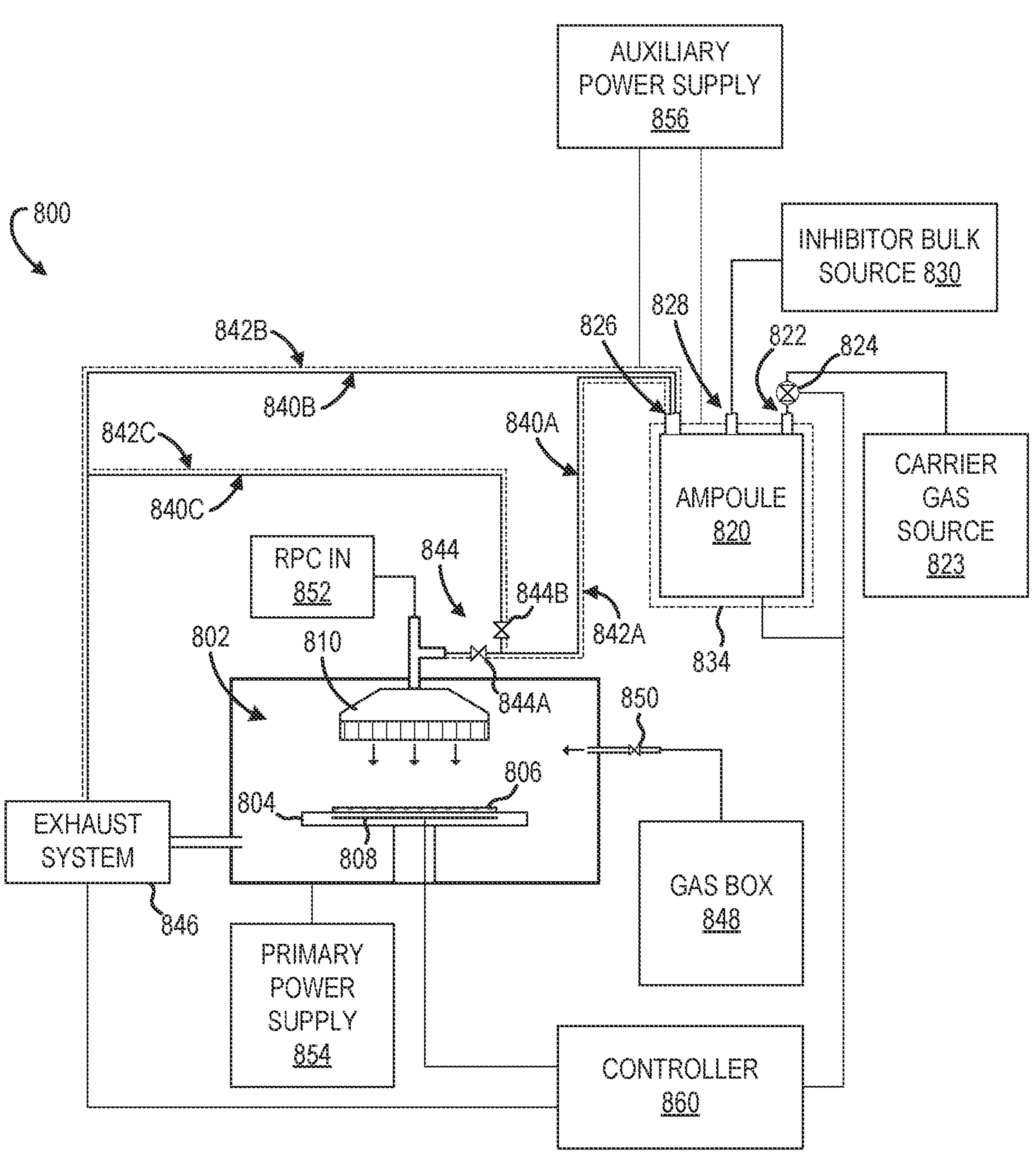
FIG. 8 shows a schematic view of an example chemical vapor deposition (CVD) tool for depositing an inhibitor with a low vapor pressure onto a substrate.

FIG. 8 shows a schematic view of an example processing tool 800 configured for depositing an inhibitor with a low vapor pressure onto a substrate. Processing tool 800 is configured as a CVD tool. Processing tool 800 comprises a processing chamber 802 and a substrate support 804 within the processing chamber. Substrate support 804 is configured to support a substrate 806 disposed within processing chamber 802. Substrate support 804 may comprise a pedestal, a chuck, and/or any other suitable structure.

Processing chamber 802 further includes a substrate heater 808 configured to heat a substrate placed on substrate support 804. In other examples, a substrate heater may be located elsewhere within processing chamber 802, or may be omitted.

Processing tool 800 further comprises a processing gas outlet 810. In some examples, processing gas outlet 810 may comprise a nozzle, showerhead, or other apparatus for introducing gas into processing chamber 802. Substrate support 804 can be raised and lowered to adjust the spacing between substrate 806 and processing gas outlet 810. In some examples, processing gas outlet 810 may comprise a heater.

Processing tool 800 further comprises an ampoule 820 configured to hold a liquid phase processing chemical comprising a vapor pressure. Ampoule 820 is further configured to supply a flow of the vapor of the chemical in the ampoule by FOV. In some examples, the chemical comprises an inhibitor configured to selectively deposit onto metal surfaces and inhibit oxide film growth. When ampoule 820 is holding a volume of liquid inhibitor, inhibitor in the gas phase occupies at least a portion of the ampoule. In other examples, ampoule 820 may hold a liquid phase processing chemical other than an inhibitor.

Ampoule 820 comprises a FOV gas inlet 822 for flowing a carrier gas from a carrier gas source 823 into ampoule 820. Example carrier gases include $N_2$, Ar, He, Ne, or Kr. FOV gas inlet 822 includes a mass flow controller 824 for controlling the flow of the carrier gas. In some examples, where carrier gas source 823 comprises nitrogen, mass flow controller 824 is configured as a nitrogen mass flow controller. In other examples, mass flow controller 824 is configured for controlling the flow of a different carrier gas.

Ampoule 820 further comprises a FOV gas outlet 826 for flowing gas out of ampoule 820. When a carrier gas is flowed through ampoule 820, the carrier gas flows over the surface of the liquid inhibitor and draws inhibitor gas through FOV gas outlet 826. Thus, the carrier gas flows with the inhibitor through FOV gas outlet 826.

Ampoule 820 further comprises a bulkfill port 828 for refilling the ampoule with inhibitor from an inhibitor bulk source 830. In other examples, an ampoule may be refilled using a different method, such as by replacing a removable reservoir of inhibitor. Further, examples utilizing a liquid phase processing chemical other than an inhibitor, a bulk source of the liquid phase processing chemical other than the inhibitor may be included.

Processing tool 800 further comprises an ampoule heater 834 for heating ampoule 820. Ampoule heater 834 may comprise any suitable configuration of one or more heating elements. In some examples, ampoule heater 834 may comprise a plurality of heating elements configured to apply heat to different locations on ampoule 820. As examples, ampoule heater 834 may comprise one or more of a cartridge heater, a ribbon heater, a jacket heater, a molded heater, or heating coil. In some examples, ampoule heater 834 comprises a heater disposed below ampoule 820 and one or more heaters disposed around the sides of ampoule 820. In other examples, ampoule heater 834 may comprise any other suitable configuration.

As mentioned above, an inhibitor in liquid phase may have low vapor pressure. The vapor pressure of the inhibitor may increase with temperature. As one example, an inhibitor may have a vapor pressure of ≤10 torr at 60° C., ≤15 torr at 80° C., ≤25 torr at 100° C., and ≤50 torr at 120° C. Other liquid phase processing chemicals, including other inhibitors, may have vapor pressures outside of these ranges. By heating ampoule 820, ampoule heater 834 increases the vapor pressure of the inhibitor. This allows the processing tool 800 to deliver more inhibitor in a flow of a carrier gas.

Processing tool 800 further comprises a plurality of heated gas lines. More specifically, in this example, processing tool 800 includes a heated gas line 840A, a heated divert gas line 840B, and a heated maintenance vacuum line 840C. Heated gas line 840A, heated divert gas line 840B, and heated maintenance vacuum line 840C are respectively heated by gas line heaters 842A, 842B, 842C. The gas line heaters 842A, 842B, 842C are shown schematically as dashed lines. Gas line heaters 842A, 842B, 842C each may comprise any suitable configuration of one or more heating elements. As examples, gas line heaters 842A, 842B, 842C each may comprise one or more of a jacket heater, a ribbon heater, or a molded heater. Gas line heaters 842A, 842B, 842C may be controlled to respectively heat heated gas line 840A, heated divert gas line 840B, and heated maintenance vacuum line 840C to any suitable temperature or temperatures. The use of gas line heaters 842A, 842B, 842C helps to prevent vapor phase inhibitor from condensing on surfaces within heated gas line 840A, heated divert gas line 840B, and heated maintenance vacuum line 840C.

Heated gas line 840A is connected to FOV gas outlet 826. During operation, gas from FOV gas outlet 826 flows through heated gas line 840A to processing chamber 802. Gas line heater 842A is configured to heat heated gas line 840A. As mentioned above, by flowing gas through one or more heated gas lines, processing tool 800 may help avoid condensation of inhibitor within the heated gas lines.

Processing tool 800 further comprises a divert valve system 844 disposed along heated gas line 840A. Heated divert gas line 840B is connected to divert valve system 844 and leads to an exhaust system 846. Gas line heater 842B is configured to heat heated divert gas line 840B. Exhaust system 846 is configured to receive gas outflowing from processing chamber 802 and/or one or more heated gas lines. In some examples, exhaust system 846 is configured to actively remove gas from processing chamber 802 and/or apply a partial vacuum. Exhaust system 846 may comprise any suitable hardware, including one or pumps.

Divert valve system 844 can be controlled to divert gas flow away from processing chamber 802 and flow gas through heated divert gas line 840B to exhaust system 846. Divert valve system 844 comprises a first valve 844A and a second valve 844B. When gas is to be diverted to exhaust system 846, divert valve system 844 can be controlled to close first valve 844A and open second valve 844B without trapping gas. As such, divert valve system 844 may help avoid condensation of the inhibitor within gas lines or valves.

Heated maintenance vacuum line 840C is configured to remove gas from ampoule 820 to exhaust system 846. Removal of carrier gas and inhibitor vapor from ampoule 820 may facilitate maintenance on ampoule 820. Gas line heater 842C is configured to heat heated maintenance vacuum line 840C. As mentioned above, exhaust system 846 may be configured to apply a partial vacuum to facilitate removal of gas from ampoule 820 and/or heated gas lines.

Processing tool 800 further comprises a gas box 848 comprising one or more gas sources. In other examples, a gas box may be separate from processing tool 800. Processing tool 800 further comprises a valve 850 for controlling a flow of one or more gases from gas box 848 into processing chamber 802. Gas box 848 may comprise gas sources for one or more gases. In some examples, gas box 848 comprises one or more inert gases for use as a carrier gas.

Processing tool 800 further comprises a remote plasma system 852 configured to form a remote plasma to clean processing chamber 802. Radicals formed in the plasma may be introduced into processing chamber 802 through processing gas outlet 810. The radicals may help clean processing chamber 802 by reacting with deposited material on surfaces within processing chamber 802. Remote plasma system 852 also may be used to provide radicals for substrate processing.

Processing tool 800 further comprises a main power source 854 for supplying power to components of processing tool 800, such as pumps, sensors, substrate heater 808, exhaust system 846, and valves 844A, 844B, 850. Processing tool 800 further comprises an auxiliary power source 856 for supplying power to gas line heaters 842A, 842B, 842C. In some examples, gas line heaters may be powered by main power source 854 and auxiliary power source 856 may be omitted.

Processing tool 800 further comprises a controller 860 for controlling operation of processing tool 800. Controller 860 is configured to control various functions of processing tool 800, such as operating substrate heater 808 to heat to a desired temperature.

Controller 860 is configured to control mass flow controller 824 to flow carrier gas into ampoule 820 at a desired flow rate. In some examples, controller 860 is configured to control mass flow controller 824 to flow nitrogen into ampoule 820 at a flow rate within a range of 1000 to 7500 standard cubic centimeters per minute (sccm). The carrier gas draws inhibitor out of ampoule 820 through FOV gas outlet 826. In some examples, the flow of nitrogen is controlled to achieve a flow of inhibitor through FOV gas outlet 826 that is within a range of 20 to 500 sccm. In other examples, any other suitable flow rates may be used. Flow rates may be dependent upon inhibitor vapor pressure and/or ampoule temperature.

Controller 860 is further configured to control components of ampoule 820. In some examples, controller 860 is configured to receive a signal from ampoule 820 indicating a liquid level of inhibitor in ampoule 820. In some examples, controller 860 is configured to output liquid level information to a display (not shown in FIG. 8). In some examples, controller 860 is configured to control a bulk fill system to fill ampoule 820 with inhibitor. For example, controller 860 may control one or more pumps to pump inhibitor from inhibitor bulk source 830 into ampoule 820 through bulkfill port 828. In other examples, inhibitor may be added manually to ampoule 820. In some examples, controller 860 is configured to control ampoule 820 to fill with inhibitor based on a liquid level that is below a threshold value. Liquid level sensors are described in more detail below with respect to FIG. 9.

Controller 860 is further configured to control ampoule heater 834 to heat to a desired temperature. In some examples, ampoule heater may be controlled to heat an inhibitor or other liquid phase processing chemical to a temperature within a range of 60 to 130° C. In more specific examples, ampoule heater may heat to a temperature within a range of 80 to 100° C. In other examples, temperatures outside these ranges may be used. In the instance of an inhibition process, a temperature to which ampoule heater is heated depends upon a specific inhibitor contained in the ampoule and a desired vapor pressure.

Controller 860 is further configured to control gas line heaters 842A, 842B, 842C to respectively heat heated gas line 840A, heated divert gas line 840B, heated maintenance vacuum line 840C to desired temperatures. In some examples in which the chemical in the ampoule is an inhibitor, controller 860 may control one or more gas line heaters to heat to a temperature within a range of 100 to 130° C. Further, in some examples, gas line heaters 842A, 842B, 842C may heat the respective heated gas line 840A, heated divert gas line 840B, heated maintenance vacuum line 840C, to a temperature that is above a temperature of an ampoule heater.

Controller 860 is further configured to operate divert valve system 844 to direct inhibitor either to processing chamber 802 or to exhaust system 846. Controller 860 is further configured to operate exhaust system 846. Controller 860 is also configured to operate valve 850 and exhaust system 846 to purge processing chamber 802 by flowing an inert gas into processing chamber 802 and evacuating processing chamber 802. Controller 860 also may be configured to operate other components of processing tool 800 not shown here. Controller 860 may comprise any suitable computing system, examples of which are described below with reference to FIG. 12.

Figure 9:
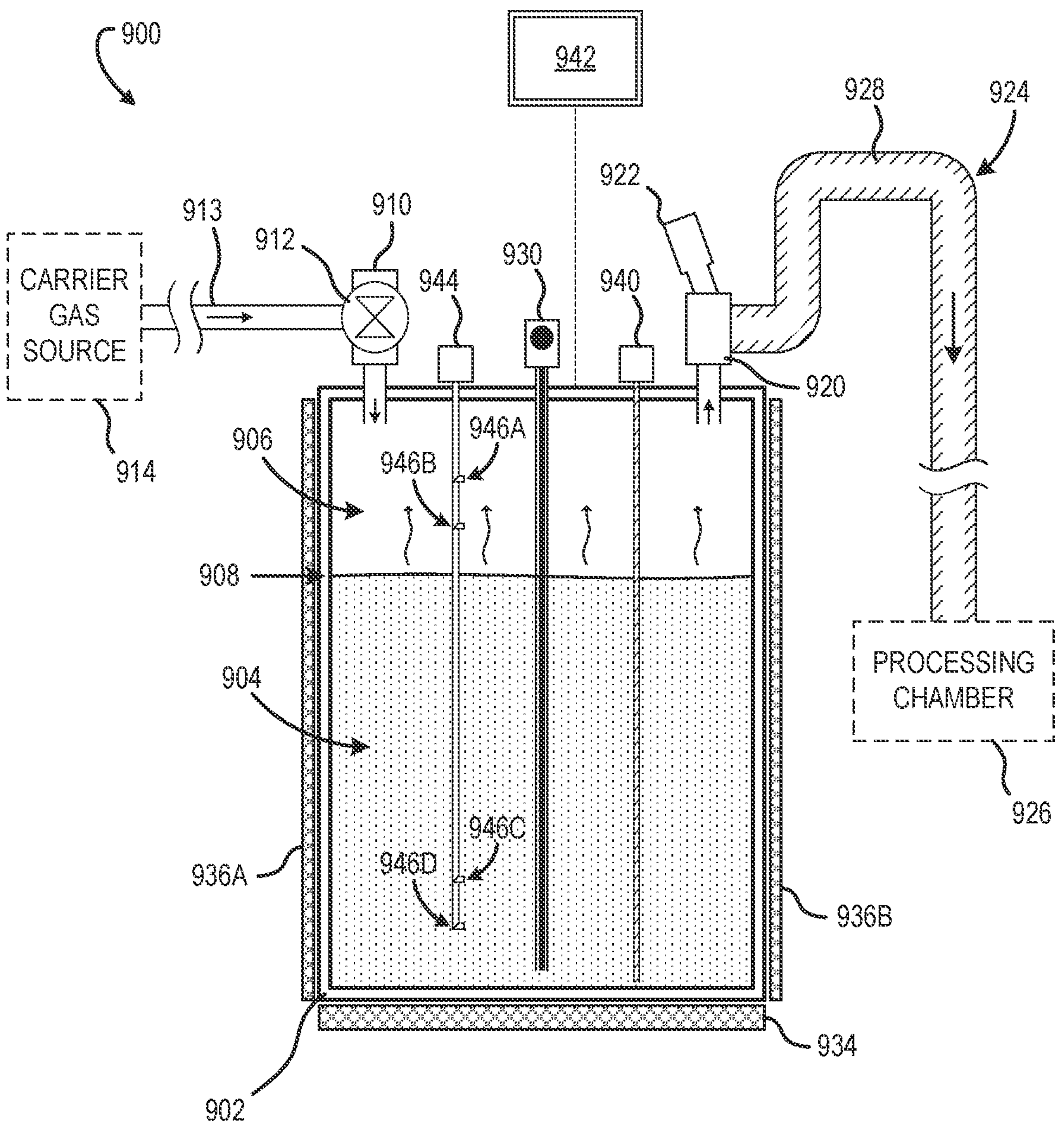
FIG. 9 shows a schematic view of an example ampoule comprising an inhibitor with a low vapor pressure.

FIG. 9 schematically shows a sectional view of an example ampoule assembly 900. Ampoule assembly 900 comprises an ampoule 902 configured to hold a liquid phase processing chemical. In the depicted example, the liquid phase processing chemical comprises an inhibitor 904 with a low vapor pressure. In such an example, ampoule assembly 900 is configured to supply inhibitor 904 for use in a processing chamber (e.g., processing chamber 802 of FIG. 8). Ampoule 902 is an example of ampoule 820. Ampoule 902 may comprise any suitable configuration. In some examples, ampoule 902 may comprise a round or elliptic cylindrical shape. In other examples, ampoule 902 may have a polygonal shape. Further, in other examples, an ampoule according to the present disclosure may be configured to hold any other suitable liquid phase processing chemical than an inhibitor.

Inhibitor 904 is liquid at typical operating temperatures. Inhibitor 904 is also present as a vapor within a volume 906 above the surface of the liquid inhibitor indicated by liquid level 908. Inhibitor 904 may comprise a material with a low vapor pressure. Such an inhibitor may have a vapor pressure of ≤10 torr at 60° C., ≤15 torr at 80° C., ≤25 torr at 100° C., and ≤50 torr at 120° C. In other examples, an inhibitor may be used with a vapor pressure outside of these ranges. As discussed above, heating the ampoule increases the vapor pressure of inhibitor 904. However, there may be an upper limit to the ampoule temperature due to safety concerns and/or a threshold temperature of decomposition for inhibitor 904. Thus, in some examples, the ampoule is heated to a temperature that is below a threshold. Ampoule 902 may comprise one or more temperature sensors for sensing the temperature of inhibitor 904.

Ampoule 902 further comprises a FOV gas inlet 910 for flowing a carrier gas into the ampoule, as indicated by arrows. FOV gas inlet 910 includes a mass flow controller 912 for controlling the flow of the carrier gas. A gas line 913 connects FOV gas inlet 910 to a carrier gas source 914. Example carrier gases include $N_2$, Ar, He, Ne, or Kr. In examples that utilize $N_2$ as a carrier gas, mass flow controller 912 is configured as a nitrogen mass flow controller. In other examples, mass flow controller 912 is configured for controlling the flow of a different carrier gas. Gas line 913 is connected to a gas box (e.g., gas box 848 of FIG. 8) configured to supply carrier gas to ampoule 902.

Ampoule 902 further comprises a FOV gas outlet 920 for flowing gas out of ampoule 902. When a carrier gas is flowed into FOV gas inlet 910, the carrier gas flows over the surface of inhibitor 904 and draws inhibitor from volume 906 through FOV gas outlet 920. The carrier gas flows with the inhibitor through FOV gas outlet 920. FOV gas outlet 920 comprises a pressure sensor 922 configured to sense a pressure at the FOV gas outlet. Pressure sensor 922 may comprise a differential pressure gauge, for example. Heating ampoule 902 may increase the vapor pressure of inhibitor 904, thus increasing a flow rate at which inhibitor vapor is withdrawn through FOV gas outlet 920. This may help shorten process times compared to the use of lower temperatures and/or lower vapor pressures.

Ampoule assembly 900 further comprises a heated gas line 924 connected to FOV gas outlet 920. Heated gas line 924 leads to a processing gas outlet of a processing chamber 926 (e.g., processing gas outlet 810 of FIG. 8). Ampoule assembly further comprises gas line heater 928 configured to heat heated gas line 924. Gas line heater 928 may comprise any suitable type of heater. Examples include jacket heaters, ribbon heaters, and molded heaters. Gas line heater 928 may be controlled to heat heated gas line 924 to any suitable temperature. In some examples, gas line heater 928 is controlled to heat to a temperature within a range of 100 to 130° C. In other examples, temperatures outside this range may be used.

In some examples, a maintenance vacuum gas line is also connected to ampoule 902. In some such examples, the maintenance vacuum gas line may be connected to FOV gas outlet 920. In other examples, ampoule 902 may comprise an additional port for connecting to the maintenance vacuum gas line. The maintenance vacuum gas line may be used to remove gas from ampoule 902 to facilitate maintenance. Further, the maintenance vacuum gas line may be heated using one or more gas line heaters.

Ampoule 902 further comprises a bulkfill port 930 for refilling the ampoule with inhibitor from an inhibitor bulk source (e.g., inhibitor bulk source 830). For example, one or more pumps may be controller to pump inhibitor from the inhibitor bulk source through bulkfill port 930 into ampoule 902. In other examples, an ampoule may be refilled using a different machine-assisted method. In yet other examples, a user may refill ampoule 902 manually through bulkfill port 930.

Ampoule assembly 900 further comprises ampoule heaters 934, 936A, 936B. Ampoule heater 934 is disposed on a lower side of ampoule 902 for heating the bottom of the ampoule. Ampoule heaters 936A, 936B are disposed on the sides of ampoule 902 for heating the side walls of ampoule 902. Ampoule heaters 934, 936A, 936B may comprise any suitable heaters, such as jacket heaters, molded heaters, ribbon heaters, heating tape, heating coils, or cartridge heaters. Ampoule assembly 900 further may comprise additional heaters not shown in FIG. 9. For example, ampoule assembly 900 further may comprise an ampoule heater disposed above ampoule 902. In some examples, ampoule assembly 900 further comprises one or more heaters for heating one or more of FOV gas inlet 910, FOV gas outlet 920, or bulkfill port 930.

Ampoule 902 further comprises a continuous liquid level sensor 940 configured to sense the liquid level 908 of inhibitor 904 within ampoule 902. Continuous liquid level sensor 940 may comprise any suitable liquid level sensor, such as an ultrasonic sensor or a microwave sensor. Continuous liquid level sensor 940 outputs a signal indicating the liquid level of inhibitor 904 to a controller (e.g., controller 860 of FIG. 8). Based on signals received from continuous liquid level sensor 940, the controller may output the liquid level of inhibitor 904 to a display 942 of ampoule assembly 900. For example, display 942 may display a percentage indicating the liquid level of inhibitor in ampoule 902. In other examples, a display may be omitted.

Ampoule 902 further comprises a discrete liquid level sensor 944. Discrete liquid level sensor 944 is configured to detect presence of inhibitor at levels 946A, 946B, 946C, 946D. In some examples, a discrete liquid level sensor may be configured for sensing liquid at a different number of levels. Discrete liquid level sensor 944 may comprise any suitable sensor, such as a float switch or a photodiode with IR emitter for each detected level. Discrete liquid level sensor 944 outputs a signal to a controller comprising information regarding the presence of liquid inhibitor at levels 946A, 946B, 946C, 946D. In some instances, liquid level 908 is between level 946B and 946C. In such instances, discrete liquid level sensor 944 outputs information indicating an absence of liquid inhibitor at levels 946A, 946B. In such instances, discrete liquid level sensor 944 also outputs information indicating a presence of liquid inhibitor at levels 946C, 946D.

When ampoule assembly 900 is incorporated in a processing tool, based on signals received from discrete liquid level sensor 944, a controller of the processing tool may output liquid level information to display 942. For example, the controller may control display 942 to display a warning if the liquid level is above an upper threshold or below a lower threshold.

The controller of the processing tool also may perform an action based on information received from the one or more liquid level sensors. For example, the controller may control the processing tool to pump liquid inhibitor into ampoule 902 based on information indicating that liquid level 908 is below a threshold level (e.g., level 946C). In some examples, the controller may output a warning if the liquid level is above an upper threshold (e.g., level 946A and/or level 946B). In some examples, the controller may output a warning if the liquid level is below a lower threshold (e.g., level 946C and/or level 946D).

While the example depicted in FIG. 9 includes one continuous liquid level sensor and one discrete liquid level sensor, in other examples, any suitable configuration of liquid level sensors may be used.

Figure 10A:
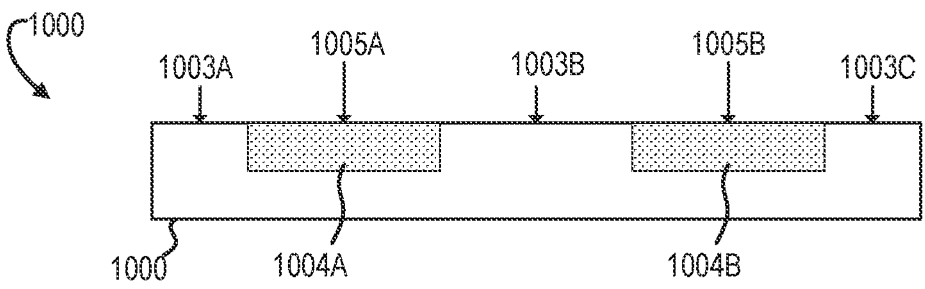
FIGS. 10A-10C schematically show an example deposition of an inhibitor onto metal surfaces of a substrate followed by deposition of an oxide film on substrate surfaces without the inhibitor.
Figure 10B:
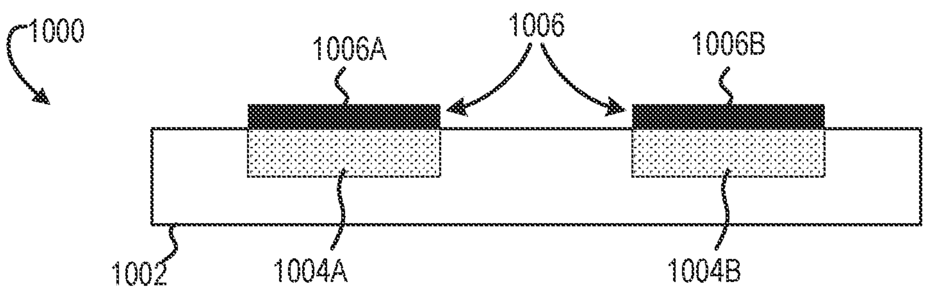
Figure 10C:
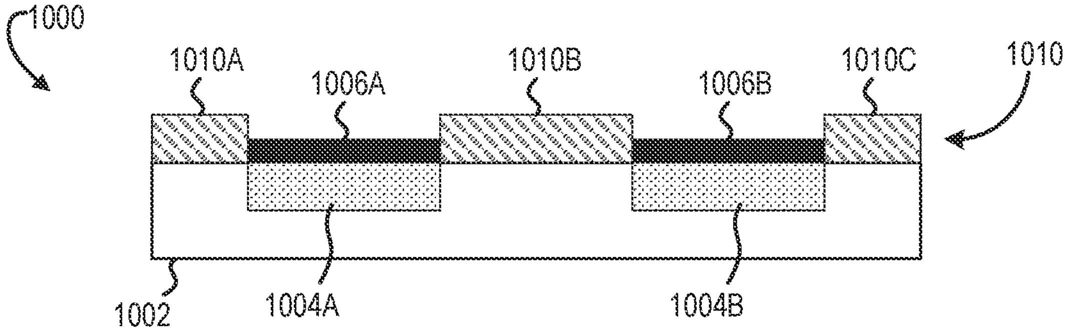

As discussed above, an inhibitor may be deposited onto a substrate and used to inhibit growth of an oxide film in a subsequent process. FIGS. 10A-10C schematically show deposition of an inhibitor onto selected surfaces of a substrate 1000 followed by selective deposition of an oxide film onto non-inhibited surfaces. Substrate 1000 may represent a structure formed during a semiconductor fabrication process. The process depicted in FIGS. 10A-10C may be performed as part of a back end of line process, for example. In semiconductor fabrication, back end of line processes include processes for forming conductors in one or more metallization layers of a wafer.

Substrate 1000 comprises an intermetal dielectric material 1002 with intermetal dielectric surfaces 1003A, 1003B, 1003C. The substrate further comprises two regions of metal 1004A, 1004B with metal surfaces 1005A, 1005B. The intermetal dielectric material 1002 may comprise any suitable dielectric material. Examples include silicon oxide and silicon nitride. Metal 1004A, 1004B may comprise any suitable metal. Examples include copper and cobalt. In some examples, substrate 1000 may be pre-treated to remove metal oxide layers from the surface of the substrate. For example, a $NH_3$ pre-treatment may be performed to remove metal oxide layers and expose metal surfaces 1005A, 1005B.

An aluminum oxide film is to be deposited onto the intermetal dielectric surfaces 1003A, 1003B, 1003C. The aluminum oxide film may not be desired on metal surfaces 1005A, 1005B. Thus, an inhibitor is used to inhibit growth of the aluminum oxide film on the metal surfaces. FIG. 10B shows deposition of an inhibitor 1006A, 1006B onto metal surfaces 1005A, 1005B. Inhibitor 1006 is configured to selectively deposit onto metal surfaces. Thus, inhibitor 1006A, 1006B adsorbs at a first concentration onto metal surfaces 1005A, 1005B and at a second concentration onto intermetal dielectric surfaces 1003A, 1003B, 1003C. The second concentration is lower than the first concentration. Inhibitor 1006 is configured to inhibit growth of oxide where the inhibitor adsorbs to the substrate surface. For example, the inhibitor may convert the metal surface from a hydrophilic surface to a hydrophobic surface.

In some examples, the inhibitor comprises a liquid with a low vapor pressure. As discussed above, it may be challenging to efficiently deposit inhibitor 1006 onto metal surfaces due to the low vapor pressure of the inhibitor. Thus, the examples described herein may facilitate the efficient deposition of inhibitor 1006A, 1006B onto metal surfaces 1005A, 1005B. Processing tool 800 is an example of a tool for depositing inhibitor 1006 onto metal surfaces 1005A, 1005B.

FIG. 10C schematically shows deposition of an aluminum oxide film 1010 onto substrate 1000. In other examples, a different material may be used, such as silicon oxide ($SiO_2$). Aluminum oxide film 1010 may be deposited by reacting one or more precursors to form a film on intermetal dielectric surfaces 1003A, 1003B, 1003C. Example aluminum-containing precursors include trimethylaluminum, dimethylaluminum isopropoxide, and triethylaluminum. Example silicon-containing precursors include silane, tris (tert-pentoxy) silanol and dimethylamino trimethylsilane. Example oxygen-containing precursors include 02, 03, and $H_2O$.

The aluminum oxide film is deposited as a first oxide film portion 1010A on intermetal dielectric surface 1003A. A second oxide film portion 1010B is deposited over intermetal dielectric surface 1003B. A third oxide film portion 1010C is deposited over intermetal dielectric surface 1003C. Due to inhibitor 1006A, 1006B, aluminum oxide film 1010 is not deposited over metal surfaces 1005A, 1005B. Aluminum oxide film 1010 may be deposited using any suitable process, such as CVD or atomic layer deposition (ALD).

Figure 11:
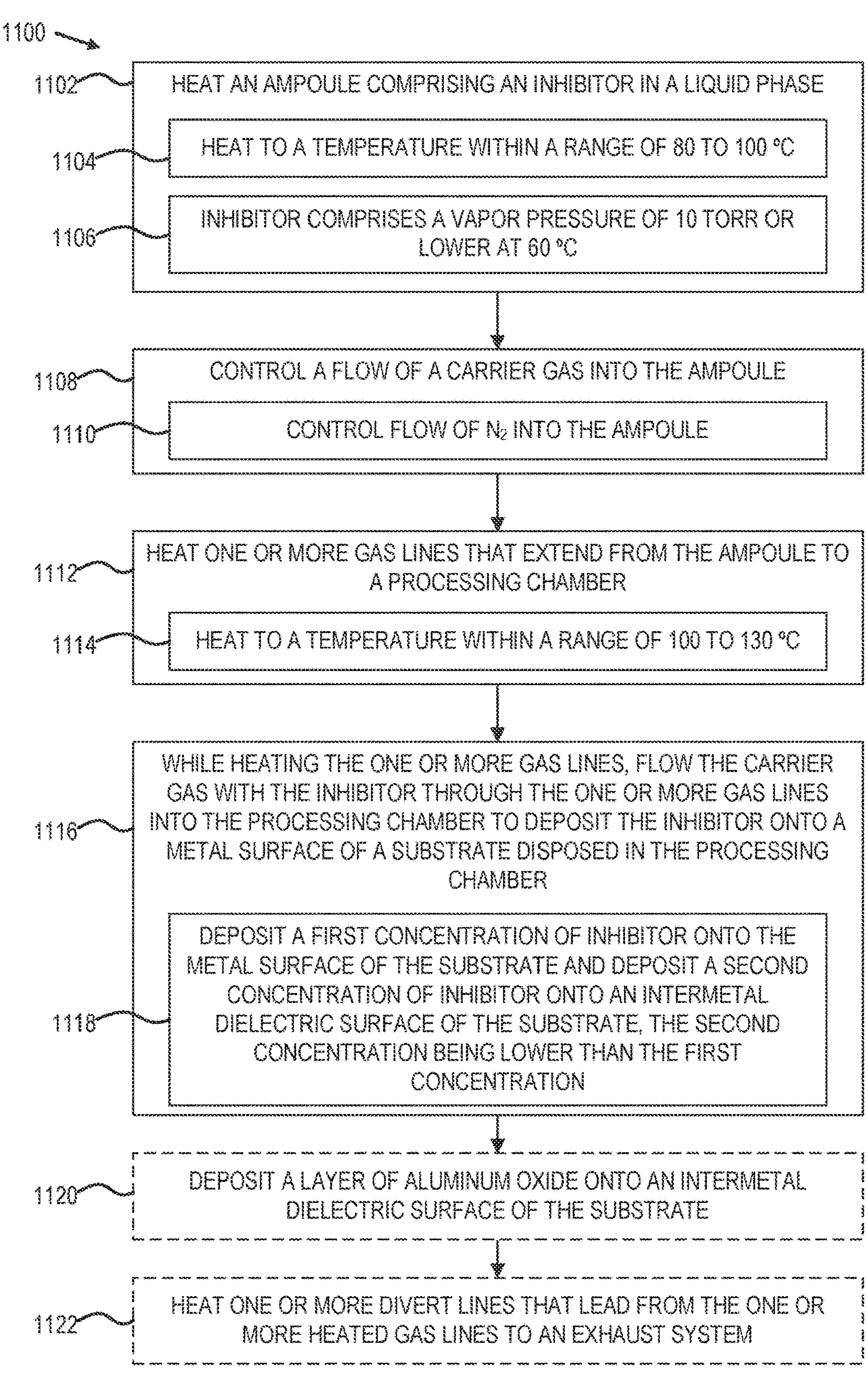
FIG. 11 shows a flow diagram of an example method for introducing an inhibitor with a low vapor pressure into a processing chamber of a CVD tool.

FIG. 11 shows a flow diagram of an example method of operating a chemical vapor deposition tool comprising a processing chamber. Processing tool 800 is an example CVD tool for performing method 1100. Method comprises, at 1102, heating an ampoule comprising an inhibitor in a liquid phase. In some examples, the ampoule may be heated to a temperature within a range of 60 to 130° C. In some examples, at 1104, heating the ampoule comprises controlling an ampoule heater to heat to a temperature within a range of 80 to 100° C. In other examples, temperatures outside these ranges may be used. In some examples, at 1106, the inhibitor comprises a vapor pressure of 10 torr or lower at 60° C. In some examples, the inhibitor comprises a vapor pressure of 15 torr or less at a temperature of 80° C. In some examples, the inhibitor comprises a vapor pressure of 25 torr or less at a temperature of 100° C. In some examples, the inhibitor comprises a vapor pressure of 50 torr or less at a temperature of 120° C. In other examples, an inhibitor may be used with a vapor pressure outside these ranges.

Method 1100 further comprises controlling a flow of a carrier gas into the ampoule at 1108. Any suitable carrier gas may be used, such as $N_2$, Ar, He, Ne, or Kr. In some examples, at 1110, controlling the flow of a carrier gas comprises controlling the flow of nitrogen into the ampoule.

Continuing, at 1112 method 1100 further comprises heating one or more gas lines that extend from the ampoule to the processing chamber. In some examples, at 1114, the method comprises heating the one or more gas lines to a temperature within a range of 100 to 130° C. In other examples, suitable temperatures outside of this range may be used. In some examples, heating the one or more gas lines comprises controlling a gas line heater to heat to a desired temperature. Examples of gas line heaters include jacket heaters, ribbon heaters, and molded heaters.

At 1116, while heating the one or more gas lines, method 1100 comprises flowing the carrier gas with the inhibitor through the one or more gas lines into the processing chamber. The method further comprises depositing the inhibitor onto a metal surface of a substrate disposed in the processing chamber, as indicated at 1116. In some examples, at 1118, the method comprises depositing a first concentration of inhibitor onto the metal surface of the substrate and depositing a second concentration of inhibitor onto an intermetallic dielectric surface of the substrate. The second concentration is lower than the first concentration.

In some examples, at 1120, method 1100 further comprises depositing a layer of aluminum oxide onto an intermetal dielectric surface of the substrate. As indicated at 1116, the metal surfaces on the substrate may be covered with adsorbed inhibitor. As such, the inhibitor deposited at 1116 inhibits and/or prevents deposition of aluminum oxide onto the metal surfaces at 1120. In some examples, at 1122, method 1100 further comprises heating one or more divert gas lines that lead from the one or more heated gas lines to an exhaust system. In other examples, a different material may be deposited onto the intermetal dielectric surface, such as silicon oxide ($SiO_2$).

Thus, the disclosed examples may help deposit inhibitors with low vapor pressure onto substrates. By heating an ampoule, the vapor pressure of the inhibitor may be increased. This helps deliver the inhibitor using FOV. Further, by using heated gas lines, the disclosed examples may help deliver the inhibitor to a processing chamber while avoiding inhibitor deposition in the gas lines. In other examples, ampoules and heated gas lines according to the present disclosure may be configured to deliver any other suitable liquid phase processing chemical.

In some embodiments, the methods and processes described herein may be tied to a computing system of one or more computing devices. In particular, such methods and processes may be implemented as a computer-application program or service, an application-programming interface (APT), a library, and/or other computer-program product.

Figure 12:
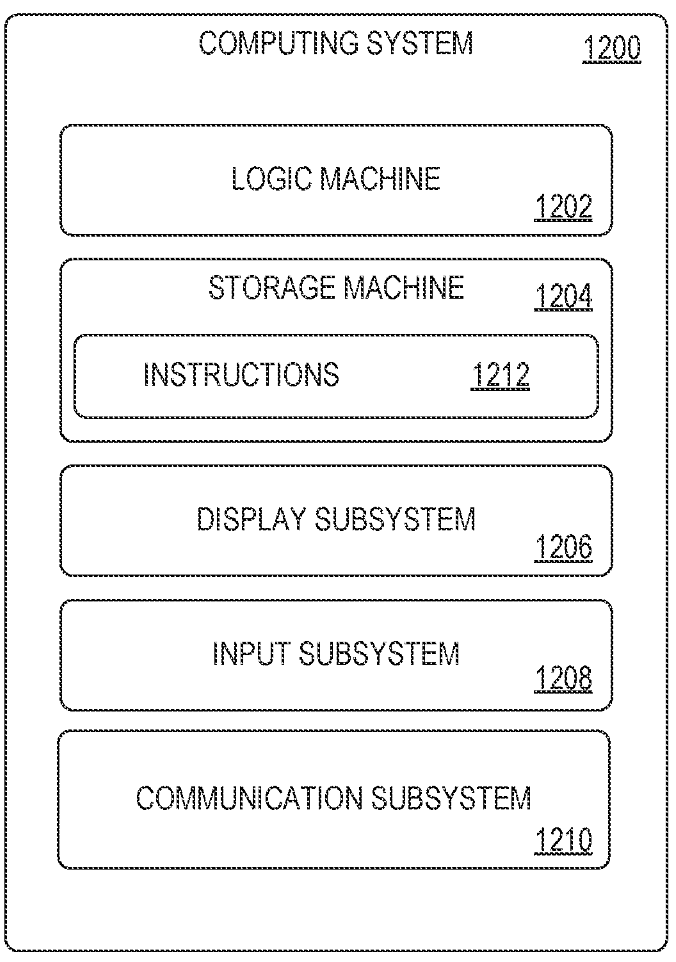
FIG. 12 shows a block diagram of an example computing system.

FIG. 12 schematically shows a block diagram of an example computing system. Computing system 1200 is shown in simplified form. Computing system 1200 may take the form of one or more personal computers, workstations, computers integrated with substrate processing tools, and/or network accessible server computers.

Computing system 1200 includes a logic machine 1202 and a storage machine 1204. Computing system 1200 may optionally include a display subsystem 1206, input subsystem 1208, communication subsystem 1210, and/or other components not shown in FIG. 12. Controller 860 is an example of computing system 1200.

Logic machine 1202 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 1204 includes one or more physical devices configured to hold instructions 1212 executable by the logic machine to implement the methods and processes described herein. When such methods and processes are implemented, the state of storage machine 1204 may be transformed e.g., to hold different data.

Storage machine 1204 may include removable and/or built-in devices. Storage machine 1204 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 1204 may include volatile, nonvolatile, dynamic, static, read/write, read-only, random-access, sequential-access, location-addressable, file-addressable, and/or content-addressable devices.

It will be appreciated that storage machine 1204 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 1202 and storage machine 1204 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 1206 may be used to present a visual representation of data held by storage machine 1204. This visual representation may take the form of a graphical user interface (GUI). As the herein described methods and processes change the data held by the storage machine, and thus transform the state of the storage machine, the state of display subsystem 1206 may likewise be transformed to visually represent changes in the underlying data. Display subsystem 1206 may include one or more display devices utilizing virtually any type of technology. Such display devices may be combined with logic machine 1202 and/or storage machine 1204 in a shared enclosure, or such display devices may be peripheral display devices.

When included, input subsystem 1208 may comprise or interface with one or more user-input devices such as a keyboard, mouse, or touch screen. In some embodiments, the input subsystem may comprise or interface with selected natural user input (NUI) componentry. Such componentry may be integrated or peripheral, and the transduction and/or processing of input actions may be handled on- or off-board. Example NUT componentry may include a microphone for speech and/or voice recognition, and an infrared, color, stereoscopic, and/or depth camera for machine vision and/or gesture recognition.

When included, communication subsystem 1210 may be configured to communicatively couple computing system 1200 with one or more other computing devices. Communication subsystem 1210 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 1200 to send and/or receive messages to and/or from other devices via a network such as the Internet.

Definitions

By "aliphatic" is meant a hydrocarbon group having at least one carbon atom to 50 carbon atoms ($C_{1-50}$), such as one to 25 carbon atoms ($C_{1-25}$), or one to ten carbon atoms ($C_{1-10}$), and which includes alkanes (or alkyl), alkenes (or alkenyl), alkynes (or alkynyl), including cyclic versions thereof, and further including straight- and branched-chain arrangements, and all stereo and position isomers as well. Such an aliphatic can be unsubstituted or substituted with one or more groups, such as groups described herein for an alkyl group.

By "alkenyl" is meant an unsaturated monovalent hydrocarbon having at least two carbon atom to 50 carbon atoms ($C_{2-50}$), such as two to 25 carbon atoms ($C_{2-25}$), or two to ten carbon atoms ($C_{2-10}$), and at least one carbon-carbon double bond, wherein the unsaturated monovalent hydrocarbon can be derived from removing one hydrogen atom from one carbon atom of a parent alkene. An alkenyl group can be branched, straight-chain, cyclic (e.g., cycloalkenyl), cis, or trans (e.g., E or Z). An exemplary alkenyl includes an optionally substituted $C_{2-24}$ alkyl group having one or more double bonds. The alkenyl group can be monovalent or multivalent (e.g., bivalent) by removing one or more hydrogens to form appropriate attachment to the parent molecular group or appropriate attachment between the parent molecular group and another substitution. The alkenyl group can also be substituted or unsubstituted. For example, the alkenyl group can be substituted with one or more substitution groups, as described herein for alkyl.

By "alkenylene" is meant a multivalent (e.g., bivalent) form of an alkenyl group, as defined herein. The alkenylene group can be substituted or unsubstituted. For example, the alkenylene group can be substituted with one or more substitution groups, as described herein for alkyl.

By "alkyl" is meant a saturated monovalent hydrocarbon having at least one carbon atom to 50 carbon atoms ($C_{1-50}$), such as one to 25 carbon atoms ($C_{1-25}$), or one to ten carbon atoms ($C_{1-10}$), wherein the saturated monovalent hydrocarbon can be derived from removing one hydrogen atom from one carbon atom of a parent compound (e.g., alkane). An alkyl group can be branched, straight-chain, or cyclic (e.g., cycloalkyl). An exemplary alkyl includes a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can also be substituted or unsubstituted. The alkyl group can be monovalent or multivalent (e.g., bivalent) by removing one or more hydrogens to form appropriate attachment to the parent molecular group or appropriate attachment between the parent molecular group and another substitution. For example, the alkyl group can be substituted with one, two, three or, in the case of alkyl groups of two carbons or more, four substituents independently selected from the group consisting of: (1) $C_{1-6}$ alkoxy (e.g., —O—R, in which R is $C_{1-6}$ alkyl); (2) $C_{1-6}$ alkylsulfinyl (e.g., —S(O)—R, in which R is $C_{1-6}$ alkyl); (3) $C_{1-6}$ alkylsulfonyl (e.g., $—SO_2—R$, in which R is $C_{1-6}$ alkyl); (4) amine (e.g., $—C(O)NR^1R^2$ or $—NHCOR^1$, where each of $R^1$ and $R^2$ is, independently, selected from hydrogen, aliphatic, heteroaliphatic, haloaliphatic, haloheteroaliphatic, aromatic, as defined herein, or any combination thereof, or $R^1$ and $R^2$, taken together with the nitrogen atom to which each are attached, form a heterocyclyl group, as defined herein); (5) aryl; (6) arylalkoxy (e.g., —O-L-R, in which L is alkyl and R is aryl); (7) aryloyl (e.g., —C(O)—R, in which R is aryl); (8) azido (e.g., $—N_3$); (9) cyano (e.g., —CN); (10) aldehyde (e.g., —C(O)H); (11) $C_{3-8}$ cycloalkyl; (12) halo; (13) heterocyclyl (e.g., as defined herein, such as a 5-, 6- or 7-membered ring containing one, two, three, or four non-carbon heteroatoms); (14) heterocyclyloxy (e.g., —O—R, in which R is heterocyclyl, as defined herein); (15) heterocyclyloyl (e.g., —C(O)—R, in which R is heterocyclyl, as defined herein); (16) hydroxyl (e.g., —OH); (17) N-protected amino; (18) nitro (e.g., $—NO_2$); (19) oxo (e.g., =O); (20) $C_{1-6}$ thioalkoxy (e.g., —S—R, in which R is alkyl); (21) thiol (e.g., —SH); (22) $—CO_2R^1$, where $R^1$ is selected from the group consisting of (a) hydrogen, (b) $C_{1-6}$ alkyl, (c) $C_{4-18}$ aryl, and (d) $C_{1-4}$ alkyl-$C_{4-18}$ aryl (e.g., -L-R, in which L is $C_{1-6}$ alkyl and R is $C_{4-18}$ aryl); (23) $—C(O)NR^1R^2$, where each of $R^1$ and $R^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (24) —$SO_2R^1$, where $R^1$ is selected from the group consisting of (a) $C_{1-6}$ alkyl, (b) $C_{4-18}$ aryl, and (c) $C_{1-6}$ alkyl-$C_{4-18}$ aryl (e.g., -L-R, in which L is $C_{1-6}$ alkyl and R is $C_{4-18}$ aryl); (25) —$SO_2NR^1R^2$, where each of $R^1$ and $R^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ s aryl (e.g., -L-R, in which L is $C_{1-6}$ alkyl and R is $C_{4-18}$ aryl); (26) —$SiR^1R^2R^3$, where each of $R^1$ and $R^2$ and $R^1$ is, independently, selected from the group consisting of (a) hydrogen, (b) halo, such as F, Cl, Br, or I, (c) $C_{1-6}$ alkyl, (d) $C_{2-6}$ alkenyl, (e) $C_{2-6}$ alkynyl, or (f) $C_{1-6}$ alkoxy (e.g., —OR, in which R is $C_{1-6}$ alkyl); and (27) —$NR^1R^2$, where each of $R^1$ and $R^2$ is, independently, selected from the group consisting of (a) hydrogen, (b) an N-protecting group, (c) $C_{1-6}$ alkyl, (d) $C_{2-6}$ alkenyl, (e) $C_{2-6}$ alkynyl, (f) $C_{4-18}$ aryl, (g) $C_{1-6}$ alkyl-$C_{4-18}$ aryl (e.g., -L-R, in which L is $C_{1-6}$ alkyl and R is $C_{4-18}$ aryl), (h) $C_{3-8}$ cycloalkyl, and (i) $C_{1-6}$ alkyl-$C_{3-8}$ cycloalkyl (e.g., -L-R, in which L is $C_{1-6}$ alkyl and R is $C_{3-8}$ cycloalkyl), wherein in one embodiment no two groups are bound to the nitrogen atom through a carbonyl group or a sulfonyl group. The alkyl group can be a primary, secondary, or tertiary alkyl group substituted with one or more substituents (e.g., one or more halo or alkoxy). In some embodiments, the unsubstituted alkyl group is a $C_{1-3}$, $C_{1-6}$, $C_{1-12}$, $C_{1-16}$, $C_{1-18}$, $C_{1-20}$, or $C_{1-24}$ alkyl group.

By "alkylene" is meant a multivalent (e.g., bivalent) form of an alkyl group, as described herein. Exemplary alkylene groups include methylene, ethylene, propylene, butylene, etc. In some embodiments, the alkylene group is a $C_{1-3}$, $C_{1-6}$, $C_{1-12}$, $C_{1-16}$, $C_{1-18}$, $C_{1-20}$, $C_{1-24}$, $C_{2-3}$, $C_{2-6}$, $C_{2-12}$, $C_{2-16}$, $C_{2-18}$, $C_{2-20}$, or $C_{2-24}$ alkylene group. The alkylene group can be branched or unbranched. The alkylene group can also be substituted or unsubstituted. For example, the alkylene group can be substituted with one or more substitution groups, as described herein for alkyl.

By "alkyleneoxy" is meant an alkylene group, as defined herein, attached to the parent molecular group through an oxygen atom.

By "alkynyl" is meant an unsaturated monovalent hydrocarbon having at least two carbon atom to 50 carbon atoms ($C_{2-50}$), such as two to 25 carbon atoms ($C_{2-25}$), or two to ten carbon atoms ($C_{2-10}$), and at least one carbon-carbon triple bond, wherein the unsaturated monovalent hydrocarbon can be derived from removing one hydrogen atom from one carbon atom of a parent alkyne. An alkynyl group can be branched, straight-chain, or cyclic (e.g., cycloalkynyl). An exemplary alkynyl includes an optionally substituted $C_{2-24}$ alkyl group having one or more triple bonds. The alkynyl group can be cyclic or acyclic and is exemplified by ethynyl, 1-propynyl, and the like. The alkynyl group can be monovalent or multivalent (e.g., bivalent) by removing one or more hydrogens to form appropriate attachment to the parent molecular group or appropriate attachment between the parent molecular group and another substitution. The alkynyl group can also be substituted or unsubstituted. For example, the alkynyl group can be substituted with one or more substitution groups, as described herein for alkyl.

By "alkynylene" is meant a multivalent (e.g., bivalent) form of an alkynyl group, as defined herein. The alkynylene group can be substituted or unsubstituted. For example, the alkynylene group can be substituted with one or more substitution groups, as described herein for alkyl.

By "aromatic" is meant a cyclic, conjugated group or moiety of, unless specified otherwise, from 5 to 15 ring atoms having a single ring (e.g., phenyl) or multiple condensed rings in which at least one ring is aromatic (e.g., naphthyl, indolyl, or pyrazolopyridinyl); that is, at least one ring, and optionally multiple condensed rings, have a continuous, delocalized π-electron system. Typically, the number of out of plane R-electrons corresponds to the Huckel rule (4n+2). The point of attachment to the parent structure typically is through an aromatic portion of the condensed ring system. Such an aromatic can be unsubstituted or substituted with one or more groups, such as groups described herein for an alkyl or aryl group. Yet other substitution groups can include aliphatic, haloaliphatic, halo, nitrate, cyano, sulfonate, sulfonyl, or others.

By "aryl" is meant an aromatic carbocyclic group comprising at least five carbon atoms to 15 carbon atoms ($C_{5-15}$), such as five to ten carbon atoms ($C_{5-10}$), having a single ring or multiple condensed rings, which condensed rings can or may not be aromatic provided that the point of attachment to a remaining position of the compounds disclosed herein is through an atom of the aromatic carbocyclic group. Aryl groups may be substituted with one or more groups other than hydrogen, such as aliphatic, heteroaliphatic, aromatic, other functional groups, or any combination thereof. Exemplary aryl groups include, but are not limited to, benzyl, naphthalene, phenyl, biphenyl, phenoxybenzene, and the like. The term aryl also includes heteroaryl, which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term non-heteroaryl, which is also included in the term aryl, defines a group that contains an aromatic group that does not contain a heteroatom. The aryl group can be substituted or unsubstituted. The aryl group can be substituted with one, two, three, four, or five substituents independently selected from the group consisting of: (1) $C_{1-6}$ alkanoyl (e.g., —C(O)—R, in which R is $C_{1-6}$ alkyl); (2) $C_{1-6}$ alkyl; (3) $C_{1-6}$ alkoxy (e.g., —O—R, in which R is $C_{1-6}$ alkyl); (4) $C_{1-6}$ alkoxy-$C_{1-6}$ alkyl (e.g., -L-O—R, in which each of L and R is, independently, $C_{1-6}$ alkyl); (5) $C_{1-6}$ alkylsulfinyl (e.g., —S(O)—R, in which R is $C_{1-6}$ alkyl); (6) $C_{1-6}$ alkylsulfinyl-$C_{1-6}$ alkyl (e.g., -L-S(O)—R, in which each of L and R is, independently, $C_{1-6}$ alkyl); (7) $C_{1-6}$ alkylsulfonyl (e.g., —$SO_2$—R, in which R is $C_{1-6}$ alkyl); (8) $C_{1-6}$ alkylsulfonyl-$C_{1-6}$ alkyl (e.g., -L-$SO_2$—R, in which each of L and R is, independently, $C_{1-6}$ alkyl); (9) aryl; (10) amine (e.g., —$NR^1R^2$, where each of $R^1$ and $R^2$ is, independently, selected from hydrogen, aliphatic, heteroaliphatic, haloaliphatic, haloheteroaliphatic, aromatic, as defined herein, or any combination thereof, or $R^1$ and $R^2$, taken together with the nitrogen atom to which each are attached, form a heterocyclyl group, as defined herein); (11) $C_{1-6}$ aminoalkyl (e.g., -$L^1$-$NR^2R^2$ or -$L^2$-$C(NR^1R^2)(R^3)$—$R^4$, in which $L^1$ is $C_{1-6}$ alkyl; L2 is a covalent bond or $C_{1-6}$ alkyl; each of $R^1$ and $R^2$ is, independently, selected from hydrogen, aliphatic, heteroaliphatic, haloaliphatic, haloheteroaliphatic, aromatic, as defined herein, or any combination thereof, or $R^1$ and $R^2$, taken together with the nitrogen atom to which each are attached, form a heterocyclyl group, as defined herein; and each of $R^3$ and $R^4$ is, independently, H or $C_{1-6}$ alkyl); (12) heteroaryl; (13) $C_{1-6}$ alkyl-$C_{4-18}$ aryl (e.g., -L-R, in which L is $C_{1-6}$ alkyl and R is $C_{4-18}$ aryl); (14) aryloyl (e.g., —C(O)—R, in which R is aryl); (15) azido (e.g., —$N_3$); (16) cyano (e.g., —CN); (17) $C_{1-6}$azidoalkyl (e.g., -L-$N_3$, in which L is $C_{1-6}$ alkyl); (18) aldehyde (e.g., —C(O)H); (19) aldehyde-$C_{1-6}$ alkyl (e.g., -L-C(O)H, in which L is $C_{1-6}$ alkyl); (20) $C_{3-8}$ cycloalkyl; (21) $C_{1-6}$ alkyl-$C_{3-8}$ cycloalkyl (e.g., -L-R, in which L is $C_{1-6}$ alkyl and R is $C_{3-8}$ cycloalkyl); (22) halo; (23) $C_{1-6}$ haloalkyl (e.g., -$L^1$-X or -$L^2$-$C(X)(R^1)$—

$R^2$, in which $L^1$ is $C_{1-6}$ alkyl; $L^2$ is a covalent bond or $C_{1-6}$ alkyl; X is fluoro, bromo, chloro, or iodo; and each of $R^1$ and $R^2$ is, independently, H or $C_{1-6}$ alkyl); (24) heterocyclyl (e.g., as defined herein, such as a 5-, 6- or 7-membered ring containing one, two, three, or four non-carbon heteroatoms); (25) heterocyclyloxy (e.g., —O—R, in which R is heterocyclyl, as defined herein); (26) heterocyclyloyl (e.g., —C(O)—R, in which R is heterocyclyl, as defined herein); (27) hydroxyl (—OH); (28) $C_{1-6}$ hydroxyalkyl (e.g., -$L^1$-OH or -$L^2$-C(OH)($R^1$)—$R^2$, in which $L^1$ is $C_{1-6}$ alkyl; L is a covalent bond or alkyl; and each of $R^1$ and $R^2$ is, independently, H or $C_{1-6}$ alkyl, as defined herein); (29) nitro; (30) $C_{1-6}$ nitroalkyl (e.g., -$L^1$-NO or -$L^2$-C(NO)($R^1$)—$R^2$, in which $L^1$ is $C_{1-6}$ alkyl; $L^2$ is a covalent bond or alkyl; and each of $R^1$ and $R^2$ is, independently, H or $C_{1-6}$ alkyl, as defined herein); (31) N-protected amino; (32) N-protected amino-$C_{1-6}$ alkyl; (33) oxo (e.g., =O); (34) $C_{1-6}$ thioalkoxy (e.g., —S—R, in which R is $C_{1-6}$ alkyl); (35) thio-$C_{1-6}$ alkoxy-$C_{1-6}$ alkyl (e.g., -L-S—R, in which each of L and R is, independently, $C_{1-6}$ alkyl); (36) —$(CH_2)_rCO_2R^1$, where r is an integer of from zero to four, and $R^1$ is selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$, alkyl and R is $C_{4-18}$ aryl); (37) —$(CH_2)_rCONR^1R^2$, where r is an integer of from zero to four and where each $R^1$ and $R^2$ is independently selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (38) —$(CH_2)_rSO_2R^1$, where r is an integer of from zero to four and where $R^1$ is selected from the group consisting of (a) $C_{1-6}$ alkyl, (b) $C_{4-18}$ aryl, and (c) $C_{1-6}$alkyl-$C_{4-18}$ aryl (e.g., -L-R, in which L is $C_{1-6}$ alkyl and R is $C_{4-18}$ aryl); (39) —$(CH_2)_rSO_2NR^1R^2$, where r is an integer of from zero to four and where each of $R^1$ and $R^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (40) —$(CH_2)_rNR^1R^2$, where r is an integer of from zero to four and where each of $R^1$ and $R^2$ is, independently, selected from the group consisting of (a) hydrogen, (b) an N-protecting group, (c) $C_{1-6}$ alkyl, (d) $C_{2-6}$ alkenyl, (e) $C_{2-6}$ alkynyl, (f) $C_{4-18}$ aryl, (g) $C_{1-6}$ alkyl-$C_{4-18}$ aryl (e.g., -L-R, in which L is $C_{1-6}$ alkyl and R is $C_{4-18}$ aryl), (h) $C_{3-8}$ cycloalkyl, and (i) $C_{1-6}$ alkyl-$C_{3-8}$ cycloalkyl (e.g., -L-R, in which L is $C_{1-6}$ alkyl and R is $C_{3-8}$ cycloalkyl), wherein in one embodiment no two groups are bound to the nitrogen atom through a carbonyl group or a sulfonyl group; (41) thiol (e.g., —SH); (42) perfluoroalkyl (e.g., —$(CF_2)_nCF_3$, in which n is an integer from 0 to 10); (43) perfluoroalkoxy (e.g., —O—$(CF_2)_nCF_3$, in which n is an integer from 0 to 10); (44) aryloxy (e.g., —O—R, in which R is aryl); (45) cycloalkoxy (e.g., —O—R, in which R is cycloalkyl); (46) cycloalkylalkoxy (e.g., —O-L-R, in which L is alkyl and R is cycloalkyl); (47) arylalkoxy (e.g., —O-L-R, in which L is alkyl and R is aryl); and (48) —$SiR^1R^2R^3$, where each of $R^1$ and $R^2$ and $R^3$ is, independently, selected from the group consisting of (a) hydrogen, (b) halo, such as F, Cl, Br, or I, (c) $C_{1-6}$ alkyl, (d) $C_{2-6}$ alkenyl, (e) $C_{2-6}$ alkynyl, or (f) $C_{1-6}$ alkoxy (e.g., —OR, in which R is $C_{1-6}$ alkyl). In particular embodiments, an unsubstituted aryl group is a $C_{4-18}$, $C_{4-14}$, $C_{4-12}$, $C_{4-10}$, $C_{6-18}$, $C_{6-14}$, $C_{6-12}$, or $C_{6-10}$ aryl group.

By "arylene" is meant a multivalent (e.g., bivalent) form of an aryl group, as described herein. Exemplary arylene groups include phenylene, naphthylene, biphenylene, triphenylene, diphenyl ether, acenaphthenylene, anthrylene, or phenanthrylene. In some embodiments, the arylene group is a $C_{4-18}$, $C_{4-14}$, $C_{4-12}$, $C_{4-10}$, $C_{6-18}$, $C_{6-14}$, $C_{6-12}$, or $C_{5-10}$ arylene group. The arylene group can be branched or unbranched. The arylene group can also be substituted or unsubstituted. For example, the arylene group can be substituted with one or more substitution groups, as described herein for aryl.

By "aryleneoxy" is meant an arylene group, as defined herein, attached to the parent molecular group through an oxygen atom.

By "cycloaliphatic" is meant an aliphatic group, as defined herein, that is cyclic. Such cycloaliphatic groups can be saturated or unsaturated.

By "cycloalkyl" is meant a monovalent saturated or unsaturated non-aromatic cyclic hydrocarbon group of from three to eight carbons, unless otherwise specified, and is exemplified by cyclopropyl, cyclobutyl, cyclopentyl, cyclohexyl, cycloheptyl, bicyclo[2.2.1.heptyl], and the like. The cycloalkyl group can also be substituted or unsubstituted. For example, the cycloalkyl group can be substituted with one or more groups including those described herein for alkyl.

By "cycloheteroaliphatic" is meant a heteroaliphatic group, as defined herein, that is cyclic. Such cycloheteroaliphatic groups can be saturated or unsaturated.

By "cycloheteroalkyl" is meant a monovalent saturated or unsaturated non-aromatic cyclic hydrocarbon group of from three to eight carbons and having at least one heteroatom, which can be selected from, but not limited to oxygen, nitrogen, sulfur, silicon, boron, selenium, phosphorous, and oxidized forms thereof within the group. The cycloheteroalkyl group can also be substituted or unsubstituted. For example, the cycloheteroalkyl group can be substituted with one or more groups including those described herein for alkyl.

By "heteroaliphatic" is meant an aliphatic group, as defined herein, including at least one heteroatom to 20 heteroatoms, such as one to 15 heteroatoms, or one to 5 heteroatoms, which can be selected from, but not limited to oxygen, nitrogen, sulfur, silicon, boron, selenium, phosphorous, and oxidized forms thereof within the group.

By "heteroalkyl," "heteroalkenyl," and "heteroalkynyl" is meant an alkyl, alkenyl, or alkynyl group (which can be branched, straight-chain, or cyclic), respectively, as defined herein, including at least one heteroatom to 20 heteroatoms, such as one to 15 heteroatoms, or one to 5 heteroatoms, which can be selected from, but not limited to, oxygen, nitrogen, sulfur, silicon, boron, selenium, phosphorous, and oxidized forms thereof within the group. The heteroalkyl, heteroalkenyl, and/or heteroalkynyl groups can also be substituted or unsubstituted. For example, the heteroalkyl, heteroalkenyl, and/or heteroalkynyl groups can be substituted with one or more groups including those described herein for alkyl.

By "heteroalkylene," "heteroalkenylene," and "heteroalkynylene" is meant an alkylene, alkenylene, or alkynylene group (which can be branched, straight-chain, or cyclic), respectively, as defined herein, including at least one heteroatom to 20 heteroatoms, such as one to 15 heteroatoms, or one to 5 heteroatoms, which can be selected from, but not limited to, oxygen, nitrogen, sulfur, silicon, boron, selenium, phosphorous, and oxidized forms thereof within the group. The heteroalkylene, heteroalkenylene, and/or heteroalkynylene groups can also be substituted or unsubstituted. For example, the heteroalkylene, heteroalkenylene, and/or heteroalkynylene groups can be substituted with one or more groups including those described herein for alkyl.

By "heterocyclyl" is meant a 3-, 4-, 5-, 6- or 7-membered ring (e.g., a 5-, 6- or 7-membered ring), unless otherwise specified, containing one, two, three, or four non-carbon heteroatoms (e.g., independently selected from the group consisting of nitrogen, oxygen, phosphorous, sulfur, selenium, or halo). The 3-membered ring has zero to one double bonds, the 4- and 5-membered ring has zero to two double bonds, and the 6- and 7-membered rings have zero to three double bonds. The term "heterocyclyl" also includes bicyclic, tricyclic and tetracyclic groups in which any of the above heterocyclic rings is fused to one, two, or three rings independently selected from the group consisting of an aryl ring, a cyclohexane ring, a cyclohexene ring, a cyclopentane ring, a cyclopentene ring, and another monocyclic heterocyclic ring, such as indolyl, quinolyl, isoquinolyl, tetrahydroquinolyl, benzofuryl, benzothienyl and the like. Heterocyclics include acridinyl, adenyl, alloxazinyl, azaadamantanyl, azabenzimidazolyl, azabicyclononyl, azacycloheptyl, azacyclooctyl, azacyclononyl, azahypoxanthinyl, azaindazolyl, azaindolyl, azecinyl, azepanyl, azepinyl, azetidinyl, azetyl, aziridinyl, azirinyl, azocanyl, azocinyl, azonanyl, benzimidazolyl, benzisothiazolyl, benzisoxazolyl, benzodiazepinyl, benzodiazocinyl, benzodihydrofuryl, benzodioxepinyl, benzodioxinyl, benzodioxanyl, benzodioxocinyl, benzodioxolyl, benzodithiepinyl, benzodithiinyl, benzodioxocinyl, benzofuranyl, benzophenazinyl, benzopyranonyl, benzopyranyl, benzopyrenyl, benzopyronyl, benzoquinolinyl, benzoquinolizinyl, benzothiadiazepinyl, benzothiadiazolyl, benzothiazepinyl, benzothiazocinyl, benzothiazolyl, benzothienyl, benzothiophenyl, benzothiazinonyl, benzothiazinyl, benzothiopyranyl, benzothiopyronyl, benzotriazepinyl, benzotriazinonyl, benzotriazinyl, benzotriazolyl, benzoxathiinyl, benzotrioxepinyl, benzoxadiazepinyl, benzoxathiazepinyl, benzoxathiepinyl, benzoxathiocinyl, benzoxazepinyl, benzoxazinyl, benzoxazocinyl, benzoxazolinonyl, benzoxazolinyl, benzoxazolyl, benzylsultamyl benzylsultimyl, bipyrazinyl, bipyridinyl, carbazolyl (e.g., 4H-carbazolyl), carbolinyl (e.g., R-carbolinyl), chromanonyl, chromanyl, chromenyl, cinnolinyl, coumarinyl, cytdinyl, cytosinyl, decahydroisoquinolinyl, decahydroquinolinyl, diazabicyclooctyl, diazetyl, diaziridinethionyl, diaziridinonyl, diaziridinyl, diazirinyl, dibenzisoquinolinyl, dibenzoacridinyl, dibenzocarbazolyl, dibenzofuranyl, dibenzophenazinyl, dibenzopyranonyl, dibenzopyronyl (xanthonyl), dibenzoquinoxalinyl, dibenzothiazepinyl, dibenzothiepinyl, dibenzothiophenyl, dibenzoxepinyl, dihydroazepinyl, dihydroazetyl, dihydrofuranyl, dihydrofuryl, dihydroisoquinolinyl, dihydropyranyl, dihydropyridinyl, dihydroypyridyl, dihydroquinolinyl, dihydrothienyl, dihydroindolyl, dioxanyl, dioxazinyl, dioxindolyl, dioxiranyl, dioxenyl, dioxinyl, dioxobenzofuranyl, dioxolyl, dioxotetrahydrofuranyl, dioxothiomorpholinyl, dithianyl, dithiazolyl, dithienyl, dithiinyl, furanyl, furazanyl, furoyl, furyl, guaninyl, homopiperazinyl, homopiperidinyl, hypoxanthinyl, hydantoinyl, imidazolidinyl, imidazolinyl, imidazolyl, indazolyl (e.g., 1H-indazolyl), indolenyl, indolinyl, indolizinyl, indolyl (e.g., 1H-indolyl or 3H-indolyl), isatinyl, isatyl, isobenzofuranyl, isochromanyl, isochromenyl, isoindazoyl, isoindolinyl, isoindolyl, isopyrazolonyl, isopyrazolyl, isoxazolidiniyl, isoxazolyl, isoquinolinyl, isoquinolinyl, isothiazolidinyl, isothiazolyl, morpholinyl, naphthindazolyl, naphthindolyl, naphthiridinyl, naphthopyranyl, naphthothiazolyl, naphthothioxolyl, naphthotriazolyl, naphthoxindolyl, naphthyridinyl, octahydroisoquinolinyl, oxabicycloheptyl, oxauracil, oxadiazolyl, oxazinyl, oxaziridinyl, oxazolidinyl, oxazolidonyl, oxazolinyl, oxazolonyl, oxazolyl, oxepanyl, oxetanonyl, oxetanyl, oxetyl, oxtenayl, oxindolyl, oxiranyl, oxobenzoisothiazolyl, oxochromenyl, oxoisoquinolinyl, oxoquinolinyl, oxothiolanyl, phenanthridinyl, phenanthrolinyl, phenazinyl, phenothiazinyl, phenothienyl (benzothiofuranyl), phenoxathiinyl, phenoxazinyl, phthalazinyl, phthalazonyl, phthalidyl, phthalimidinyl, piperazinyl, piperidinyl, piperidonyl (e.g., 4-piperidonyl), pteridinyl, purinyl, pyranyl, pyrazinyl, pyrazolidinyl, pyrazolinyl, pyrazolopyrimidinyl, pyrazolyl, pyridazinyl, pyridinyl, pyridopyrazinyl, pyridopyrimidinyl, pyridyl, pyrimidinyl, pyrimidyl, pyronyl, pyrrolidinyl, pyrrolidonyl (e.g., 2-pyrrolidonyl), pyrrolinyl, pyrrolizidinyl, pyrrolyl (e.g., 2H-pyrrolyl), pyrylium, quinazolinyl, quinolinyl, quinolizinyl (e.g., 4H-quinolizinyl), quinoxalinyl, quinuclidinyl, selenazinyl, selenazolyl, selenophenyl, succinimidyl, sulfolanyl, tetrahydrofuranyl, tetrahydrofuryl, tetrahydroisoquinolinyl, tetrahydroisoquinolyl, tetrahydropyridinyl, tetrahydropyridyl (piperidyl), tetrahydropyranyl, tetrahydropyronyl, tetrahydroquinolinyl, tetrahydroquinolyl, tetrahydrothienyl, tetrahydrothiophenyl, tetrazinyl, tetrazolyl, thiadiazinyl (e.g., 6H-1,2,5-thiadiazinyl or 2H,6H-1,5,2-dithiazinyl), thiadiazolyl, thianthrenyl, thianyl, thianaphthenyl, thiazepinyl, thiazinyl, thiazolidinedionyl, thiazolidinyl, thiazolyl, thienyl, thiepanyl, thiepinyl, thietanyl, thietyl, thiiranyl, thiocanyl, thiochromanonyl, thiochromanyl, thiochromenyl, thiodiazinyl, thiodiazolyl, thioindoxyl, thiomorpholinyl, thiophenyl, thiopyranyl, thiopyronyl, thiotriazolyl, thiourazolyl, thioxanyl, thioxolyl, thymidinyl, thyminyl, triazinyl, triazolyl, trithianyl, urazinyl, urazolyl, uretidinyl, uretinyl, uricyl, uridinyl, xanthenyl, xanthinyl, xanthionyl, and the like, as well as modified forms thereof (e.g., including one or more oxo and/or amino) and salts thereof. The heterocyclyl group can be substituted or unsubstituted. For example, the heterocyclyl group can be substituted with one or more substitution groups, as described herein for aryl.

By "heterocyclyldiyl" is meant a bivalent form of a heterocyclyl group, as described herein. In one instance, the heterocyclyldiyl is formed by removing a hydrogen from a heterocyclyl group. Exemplary heterocyclyldiyl groups include piperdylidene, quinolinediyl, etc. The heterocyclyldiyl group can also be substituted or unsubstituted. For example, the heterocyclyldiyl group can be substituted with one or more substitution groups, as described herein for heterocyclyl.

As used herein, the terms "top," "bottom," "upper," "lower," "above," and "below" are used to provide a relative relationship between structures. The use of these terms does not indicate or require that a particular structure must be located at a particular location in the apparatus.

A person of ordinary skill in the art would recognize that the definitions provided above are not intended to include impermissible substitution patterns (e.g., methyl substituted with 5 different groups, and the like). Such impermissible substitution patterns are easily recognized by a person of ordinary skill in the art. Any functional group disclosed herein and/or defined above can be substituted or unsubstituted, unless otherwise indicated therein.

The term "ampoule" may generally represent a vessel for holding a chemical. An ampoule may be at least partially filled with a chemical in liquid phase such that a remaining portion of the ampoule comprises the chemical in vapor phase.

The term "ampoule assembly" may generally represent components of a processing tool including an ampoule, ampoule heater, and gas lines for delivering a vaporized chemical from the ampoule to a processing chamber of the processing tool.

The term "ampoule heater" may generally represent a heater for heating liquid contained in an ampoule.

The term "bulkfill port" may generally represent an inlet of an ampoule for refilling the ampoule with a liquid chemical.

The term "carrier gas" may generally represent a gas used in flow-over vapor processes to transport a chemical vapor. Suitable carrier gases include inert gases such as nitrogen (Nz), argon (Ar), helium (He), neon (Ne), and krypton (Kr).

The term "chemical vapor deposition" (CVD) may generally represent a process for depositing a film on a substrate by flowing one or more chemicals over the substrate under conditions which cause the chemicals to form a film on the substrate.

The term "film" may generally represent a layer of material deposited on a substrate.

The term "flow-over vapor" (FOV) may generally represent the flow of a carrier gas over a surface of a liquid chemical to draw and transport chemical vapor with the flow of the carrier gas.

The term "flow-over vapor gas inlet" may generally represent a port on an ampoule for flowing a carrier gas into the ampoule.

The term "flow-over vapor gas outlet" may generally represent a port on an ampoule for flowing a carrier gas and vapor out of the ampoule.

The term "heated gas line" may generally represent a conduit of a chemical vapor deposition tool that is heated by one or more heaters and that is used to transport a gas-phase chemical substance.

The term "inhibitor" may generally represent a processing chemical that physisorbs or chemisorbs to a material forming a substrate surface and prevents growth of, or reduces a rate of growth of, a film on the substrate surface compared to areas of the substrate surface comprising the material without the inhibitor.

The term "intermetal dielectric" may generally represent a dielectric material positioned between metal regions in a substrate.

The term "liquid level sensor" may generally represent a sensor configured to detect a level of a liquid within an ampoule. Example liquid level sensors include discrete liquid level sensors and continuous liquid level sensors. A discrete liquid level sensor may generally represent a sensor configured to sense presence of liquid at one or more fixed levels. A continuous liquid level sensor may generally represent a sensor configured to detect a liquid level over a continuous range of levels.

The term "low vapor pressure," in reference to a chemical, may generally represent a vapor pressure that is below 10 torr at a temperature of 60° C.

The term "processing chamber" may generally represent an enclosure in which chemical and/or physical processes are performed on substrates.

The term "processing gas outlet" may generally represent a structure for injecting a gas-phase processing chemical into a processing chamber of a processing tool. A processing gas outlet may comprise a nozzle or showerhead in various examples. Example processing chemicals include film precursors, reactants, and inert gases.

The term "processing tool" may generally represent a machine comprising a processing chamber and other hardware configured to enable processing to be carried out in the processing chamber.

The term "substrate" may generally represent any object on which a film can be deposited.

The term "substrate heater" may generally represent a heater in a processing chamber configured to heat a substrate. A substrate heater may be integrated with a substrate support, or may be located elsewhere in a processing chamber.

The term "substrate support" may generally represent any structure for supporting a substrate in a processing chamber. Examples comprise pedestals, electrostatic chuck pedestals, and showerhead pedestals used for backside deposition processes.

CONCLUSION

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Although the foregoing embodiments have been described in some detail for purposes of clarity of understanding, it will be apparent that certain changes and modifications may be practiced within the scope of the appended claims. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for selective metal oxide deposition on a dielectric material relative to an exposed metal surface on a substrate, the method comprising the steps of:

(a) providing the substrate comprising the dielectric material and the exposed metal surface;

(b) contacting the substrate with a plasma generated from a hydrogen-containing source and an oxygen-containing source to generate hydroxy species, wherein the hydroxy species react with the dielectric material to form a hydroxy-terminated dielectric material and react with the exposed metal surface to form an oxidized metal surface;

(c) exposing the oxidized metal surface and the hydroxy-terminated dielectric material to a deposition inhibitor that selectively modifies the oxidized metal surface, forming an inhibited metal surface; and then (d) selectively depositing metal oxide on the hydroxy-terminated dielectric material relative to the inhibited metal surface on the substrate.

2. The method of claim 1, wherein a metal of the exposed metal surface comprises copper, cobalt, tungsten, ruthenium, tantalum, titanium, hafnium, zirconium, molybdenum or a combination thereof.

3. The method of claim 1, wherein the metal oxide comprises zirconium oxide, hafnium oxide, aluminum oxide, titanium oxide, tantalum oxide, yttrium oxide, lanthanum oxide or a combination thereof.

4. The method of claim 3, wherein the metal oxide is aluminum oxide.

5. The method of claim 4, wherein the aluminum oxide is deposited by an aluminum oxide precursor comprising trimethylaluminum, dimethylaluminum chloride, aluminum chloride, dimethylaluminum isopropoxide or triethylaluminium.

6. The method of claim 1, wherein the deposition inhibitor comprises sulfur-containing compounds, phosphorus-containing compounds or silicon-containing compounds.

7. The method of claim 1, wherein the selective metal oxide deposition comprises chemical vapor deposition.

8. The method of claim 1, further comprising treating the inhibited metal surface to remove inhibitor.

* * * * *